United States Patent
Kim et al.

(10) Patent No.: US 12,095,433 B2
(45) Date of Patent: Sep. 17, 2024

(54) ISOLATED TYPE ACTIVE EMI FILTER HAVING NO ADDITIONAL ELEMENTS ON POWER LINE

(71) Applicant: UNIST (ULSAN NATIONAL INSTITUTE OF SCIENCE AND TECHNOLOGY), Ulsan (KR)

(72) Inventors: Jin Gook Kim, Ulsan (KR); Sang Yeong Jeong, Ulsan (KR); Dong Il Shin, Ulsan (KR)

(73) Assignee: UNIST (ULSAN NATIONAL INSTITUTE OF SCIENCE AND TECHNOLOGY), Ulsan (KR)

( * ) Notice: Subject to any disclaimer, the term of this patent is extended or adjusted under 35 U.S.C. 154(b) by 762 days.

(21) Appl. No.: 17/087,340

(22) Filed: Nov. 2, 2020

(65) Prior Publication Data
US 2021/0058070 A1 Feb. 25, 2021

Related U.S. Application Data

(63) Continuation-in-part of application No. PCT/KR2019/005268, filed on May 2, 2019.

(30) Foreign Application Priority Data

May 2, 2018 (KR) .................. 10-2018-0050717

(51) Int. Cl.
| | | |
|---|---|---|
| H03H 11/04 | (2006.01) | |
| H01F 17/04 | (2006.01) | |
| H01F 17/00 | (2006.01) | |

(52) U.S. Cl.
CPC ............ *H03H 11/04* (2013.01); *H01F 17/04* (2013.01); *H01F 2017/0093* (2013.01)

(58) Field of Classification Search
CPC .. H03H 11/04; H01F 17/04; H01F 2017/0093
See application file for complete search history.

(56) References Cited

U.S. PATENT DOCUMENTS

| | | | |
|---|---|---|---|
| 7,423,520 B2 * | 9/2008 | Wasaki | ............ H03H 7/09 |
| | | | 340/12.34 |
| 2018/0269781 A1 * | 9/2018 | Amaducci | ........... H02M 1/15 |

FOREIGN PATENT DOCUMENTS

| | | |
|---|---|---|
| CN | 102714469 A | 10/2012 |
| JP | 2007274026 A * | 10/2007 |

(Continued)

OTHER PUBLICATIONS

Office Action of the corresponding Japanese Application No. 2020-561711, dated Jan. 4, 2022.

(Continued)

*Primary Examiner* — Daniel C Puentes
(74) *Attorney, Agent, or Firm* — Knobbe, Martens, Olson & Bear, LLP

(57) ABSTRACT

The present disclosure relates to an electromagnetic interference (EMI) filter for preventing noise emitted from a power line cable, and an isolated type active EMI filter having no additional elements on a power line. The EMI filter includes a common-mode (CM) choke disposed on a power source side, a Y-cap disposed on an EMI source side, and a sensing winding configured to sense a current. The EMI filter also includes an amplifier configured to amplify the noise current, and a transformer configured to inject a signal of the secondary coil into the Y-cap as a compensation signal.

9 Claims, 24 Drawing Sheets

(56) References Cited

FOREIGN PATENT DOCUMENTS

| | | |
|---|---|---|
| JP | 2011-045191 A | 3/2011 |
| JP | 2015-167460 A | 9/2015 |
| KR | 10-2001-0070924 A | 7/2001 |
| KR | 10-2005-0013647 A | 2/2005 |
| KR | 10-2012-0053606 A | 5/2012 |
| WO | WO 2013/008925 A1 | 1/2013 |

OTHER PUBLICATIONS

International Search Report and Written Opinion mailed Aug. 9, 2019 in International Application No. PCT/KR2019/005268, in 10 pages. (English translation of ISR.).

* cited by examiner

ISOLATED TYPE ACTIVE EMI FILTER HAVING NO ADDITIONAL ELEMENTS ON POWER LINE

CROSS REFERENCE TO RELATED APPLICATIONS

This is a continuation-in-part application of International Patent Application No. PCT/KR2019/005268, filed on May 2, 2019, which claims priority to Korean patent application No. 10-2018-0050717 filed on May 2, 2018, contents of each of which are incorporated herein by reference in their entireties.

BACKGROUND

Technical Field

The present disclosure relates to an electromagnetic interference (EMI) filter, and more particularly, to an isolated type active EMI filter having no additional elements on a power line. In addition, embodiments of the present disclosure relate to a current compensation device configured to actively compensate for a common-mode current that is input through two or more high-current paths connecting two devices.

Description of Related Technology

Electromagnetic interference (EMI) filters are installed in most home and industrial electrical systems to prevent conducted EMI noise emitted through power line cables.

In order to prevent common-mode conducted noise, a filter including a common-mode choke and a Y-cap is generally used. In a high-power/high-current electrical system, a noise reduction performance is degraded due to a magnetic saturation phenomenon in the common-mode choke, and to prevent this, a multi-stage filter or an expensive high-performance choke should be used to obtain sufficient reduction performance; which greatly increases the size and cost of an EMI filter. Accordingly, attempts have been made to use an active type EMI filter that may overcome the limitations of a passive EMI filter and effectively improve a filter performance, and it is preferable that there are no chokes that may be added due to the use of the active type EMI filter.

SUMMARY

The present disclosure is directed to providing an isolated type active electromagnetic interference (EMI) filter having no additional elements on a power line, which allows active circuit elements to be isolated from the power line without elements being added to the power line. In particular, the present disclosure is directed to providing an active current compensation device configured to reduce common-mode (CM) noise.

The present disclosure is also directed to providing a method of reducing EMI noise using an isolated type active EMI filter having no additional elements on a power line, which allows active circuit elements to be isolated from the power line even without elements being added to the power line.

One aspect of the present disclosure provides an isolated type active electromagnetic interference (EMI) filter having no additional elements on a power line, the filter including a common-mode (CM) choke which is disposed on a power source side from which power is supplied and has a form in which a winding is wound on each of a live line and a neutral line connected to an EMI source, a Y-cap which is disposed on an EMI source side at which EMI occurs and includes two capacitors connected in series, wherein the two capacitors are connected in parallel between the live line and the neutral line and are commonly connected to the ground, a sensing winding formed by winding a coil on the CM choke and configured to sense a noise current of the CM choke, an amplifier configured to amplify the noise current sensed by the sensing winding, and a transformer which is installed in front of the Y-cap, includes a primary coil that receives a signal amplified by the amplifier and a secondary coil that is isolated from the power line by being connected to the ground connected to the Y-cap, and injects a signal of the secondary coil into the Y-cap as a compensation signal.

Another aspect of the present disclosure provides an isolated type active electromagnetic interference (EMI) filter having no additional elements on a power line, the filter including a common-mode (CM) choke which is disposed on a power source side from which power is supplied and has a form in which a winding is wound on each of a live line and a neutral line connected to an EMI source, a Y-cap which is disposed on an EMI source side at which EMI occurs and includes two capacitors connected in series, wherein the two capacitors are connected in parallel between the live line and the neutral line and are commonly connected to the ground, a transformer which is installed in front of the Y-cap, includes a primary coil that senses a noise voltage of the Y-CAP and a secondary coil through which the noise voltage is transformed, and is isolated from the power line, an amplifier configured to amplify the noise voltage that is sensed and transformed by the transformer, and a compensation winding formed by winding a coil on the CM choke and configured to inject the noise signal amplified by the amplifier into the CM choke.

Still another aspect of the present disclosure provides an isolated type active electromagnetic interference (EMI) filter having no additional elements on a power line, the filter including a common-mode (CM) choke which is disposed on an EMI source side at which EMI occurs and has a form in which a winding is wound on each of a live line and a neutral line connected to an EMI source, a Y-cap which is disposed on a power source side from which power is supplied and includes two capacitors connected in series, wherein the two capacitors are connected in parallel between the live line and the neutral line and are commonly connected to the ground, a sensing winding formed by winding a coil on the CM choke and configured to sense a noise current of the CM choke, an amplifier configured to amplify the noise current sensed by the sensing winding, and a transformer which is installed in front of the Y-cap, includes a primary coil that receives a signal amplified by the amplifier and a secondary coil that is isolated from the power line by being connected to the ground connected to the Y-cap, and injects the signal transformed through the secondary coil into the Y-cap as a compensation signal.

Yet another aspect of the present disclosure provides an isolated type active electromagnetic interference (EMI) filter having no additional elements on a power line, the filter including a common-mode (CM) choke which is disposed on an EMI source side at which EMI occurs and has a form in which a winding is wound on each of a live line and a neutral line connected to an EMI source, a Y-cap which is disposed on a power source side from which power is supplied and includes two capacitors connected in series, wherein the two capacitors are connected in parallel between the live line and the neutral line and are commonly connected to the ground, a transformer which is installed in front of the Y-cap, includes a primary coil that senses a noise voltage of the Y-CAP and a secondary coil through which the noise voltage is transformed, and is isolated from the power line, an amplifier configured to amplify the noise voltage that is transformed by the transformer, and a compensation winding formed by winding a coil on the CM choke and configured to inject the noise signal amplified by the amplifier into the CM choke as a compensation signal.

Still yet another aspect of the present disclosure provides a method of reducing electromagnetic interference (EMI) noise using the isolated type active EMI filter having no additional elements on a power line, which is a method of reducing EMI noise by adding an active element to a passive EMI filter including a common-mode (CM) choke which is disposed on a power source side from which power is supplied and has a form in which a winding is wound on each of a live line and a neutral line connected to an EMI source and a Y-cap which is disposed on an EMI source side at which EMI occurs and includes two capacitors connected in series, wherein the two capacitors are connected in parallel between the live line and the neutral line and are commonly connected to the ground, the method including sensing a noise current of the CM choke through a sensing winding formed by winding a coil on the CM choke, amplifying the noise current sensed through the sensing winding, and transforming the amplified signal received through a primary coil of a transformer, which is installed in front of the Y-cap, through a secondary coil of the transformer and injecting the transformed signal into the Y-cap, wherein the secondary coil of the transformer is isolated from the power line by being connected to the ground connected to the Y-cap.

Still yet another aspect of the present disclosure provides a method of reducing electromagnetic interference (EMI) noise using the isolated type active EMI filter having no additional elements on a power line, which is a method of reducing EMI noise by adding an active element to a passive EMI filter including a common-mode (CM) choke which is disposed on a power source side from which power is supplied and has a form in which a winding is wound on each of a live line and a neutral line connected to an EMI source and a Y-cap which is disposed on an EMI source side at which EMI occurs and includes two capacitors connected in series, wherein the two capacitors are connected in parallel between the live line and the neutral line and are commonly connected to the ground, the method including sensing a noise voltage by a primary coil of a transformer installed in front of the Y-cap using the Y-cap as a sensing capacitor and transforming the sensed noise voltage through a secondary coil of the transformer, amplifying the noise voltage transformed through the secondary coil, and injecting the amplified noise signal into the CM choke through a compensation winding that is formed by winding a coil on the CM choke, wherein the secondary coil of the transformer is isolated from the power line by being connected to the ground connected to the Y-cap.

Still yet another aspect of the present disclosure provides a method of reducing electromagnetic interference (EMI) noise using the isolated type active EMI filter having no additional elements on a power line, which is a method of reducing EMI noise by adding an active element to a passive EMI filter including a common-mode (CM) choke which is disposed on an EMI source side at which EMI occurs and has a form in which a winding is wound on each of a live line and a neutral line connected to an EMI source and a Y-cap which is disposed on a power source side from which power is supplied and includes two capacitors connected in series, wherein the two capacitors are connected in parallel between the live line and the neutral line and are commonly connected to the ground, the method including sensing a noise current of the CM choke through a sensing winding formed by winding a coil on the CM choke, amplifying the noise current sensed through the sensing winding, and transforming the amplified signal input through a primary coil of a transformer, which is installed in front of the Y-cap, through a secondary coil of the transformer and injecting the transformed signal into the Y-cap as a compensation signal, wherein the secondary coil of the transformer is isolated from the power line by being connected to the ground connected to the Y-cap.

Still yet another aspect of the present disclosure provides a method of reducing electromagnetic interference (EMI) noise using the isolated type active EMI filter having no additional elements on a power line, which is a method of reducing EMI noise by adding an active element to a passive EMI filter including a common-mode (CM) choke which is disposed on an EMI source side at which EMI occurs and has a form in which a winding is wound on each of a live line and a neutral line connected to an EMI source and a Y-cap which is disposed on a power source side from which power is supplied and includes two capacitors connected in series, wherein the two capacitors are connected in parallel between the live line and the neutral line and are commonly connected to the ground, the method including sensing a noise voltage of the Y-cap by a primary coil of a transformer installed in front of the Y-cap and transforming the sensed noise voltage through a secondary coil of the transformer, amplifying the noise voltage, and injecting the amplified noise signal into the CM choke through a compensation winding, which is formed by winding a coil on the CM choke, as a compensation signal, wherein the secondary coil of the transformer is isolated from the power line by being connected to the ground connected to the Y-cap.

In order to prevent conducted electromagnetic interference (EMI) noise emitted through a power line cable, EMI filters should be installed in most home/industrial electrical and electronic devices, and according to an isolated type active EMI filter having no additional elements on a power line and a method of reducing EMI noise using the same of the present disclosure, the same noise reduction performance can be obtained with a smaller size and a lower price than a case in which only a passive filter is used.

Further, according to the present disclosure, when an isolated type active EMI filter having no additional elements on a power line of the present disclosure is added to a case in which a multi-stage passive EMI filter is previously used to sufficiently reduce noise, the stage number of filters can be reduced, and the size and cost of most electrical and electronic devices can be reduced.

BRIEF DESCRIPTION OF DRAWINGS

FIGS. 7A and 7B are graphs illustrating curves of an impedance $Z_{line}$ of the power line when viewed from the position of the Y-cap toward a power source, wherein FIG. 7A is the graph illustrating the curve in a case in which $N_{sen}$ violates Equation 19, and FIG. 7B is the graph illustrating the curve in a case in which $N_{sen}$ satisfies Equation 19.

FIGS. 8A and 8B illustrate the comparison of loop gains, wherein FIG. 8A illustrates the loop gain in an unstable situation without damping components $R_{d1}$, $C_d$, and $R_{d2}$ and a phase compensator of $R_c$ and $C_c$, and FIG. 8B illustrates the loop gain in a stable situation with the damping components $R_{d1}$, $C_d$, and $R_{d2}$ and the phase compensator of $R_c$ and $C_c$.

DETAILED DESCRIPTION

An active type EMI filter has a feedback circuit structure in which a noise voltage or current is sensed through a capacitor or a transformer, and a compensation voltage or current is applied back to the capacitor or the transformer to cancel the noise voltage or current. However, in the active type EMI filter, when the transformer is added to a power line to sense and compensate for the noise, the filter performance is greatly degraded due to magnetic saturation in the transformer in a high-power/high-current electrical system. That is, in the above active type EMI filter in which the transformer is not added to the power line, the noise is sensed and compensated for through the capacitor.

However, in the active type EMI filter, when the capacitor is connected to the power line to sense and compensate for the noise, active circuit elements are not isolated from the power line, and thus reliability and stability against electrical overstress (EOS) are greatly degraded. That is, a structure in which the active circuit elements are isolated from the power line even without having chokes which may be added to the power line due to the use of the active type EMI filter is necessary.

The present disclosure relates to an isolated type active electromagnetic interference (EMI) filter having no additional elements on a power line and a method of reducing EMI noise using the same, and the isolated type active EMI filter includes a common-mode (CM) choke disposed on a power source side from which power is supplied, a Y-cap, a sensing winding formed by winding a coil on the CM choke and configured to sense a noise current of the CM choke, an amplifier configured to amplify the noise current sensed by the sensing winding, and a transformer which is installed in front of the Y-cap, includes a primary coil that receives a signal amplified by the amplifier and a secondary coil that is isolated from the power line by being connected to the ground connected to the Y-cap, and injects a signal of the secondary coil into the Y-cap as a compensation signal.

MODE OF THE DISCLOSURE

Figure 1:
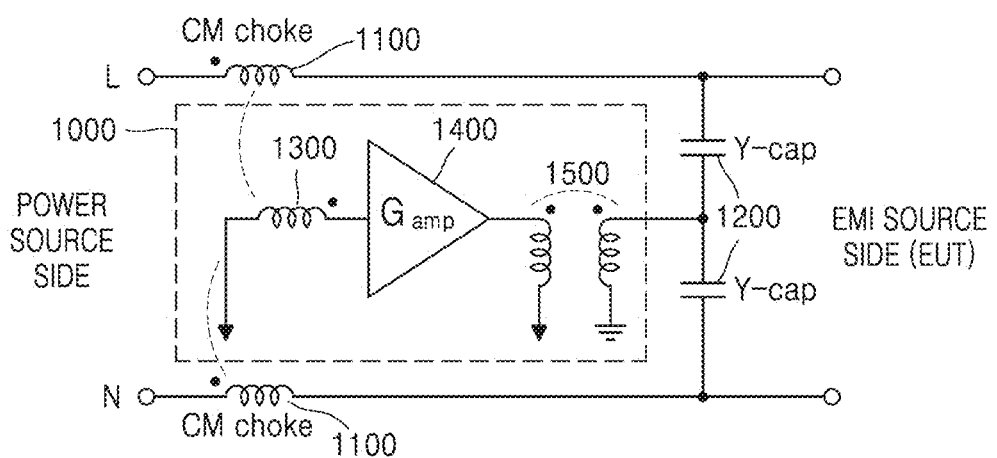
FIG. 1 is a circuit diagram illustrating a configuration of an isolated type active electromagnetic interference (EMI) filter having no additional elements on a power line according to a first embodiment of the present disclosure.

Hereinafter, exemplary embodiments of the present disclosure will be described in detail with reference to the accompanying drawings. Since embodiments described in this specification and configurations illustrated in the drawings are only exemplary embodiments of the present disclosure and do not represent the overall technological scope of the present disclosure, it should be understood that the invention covers various equivalents, modifications, and substitutions at the time of filing of this application, FIG. 1 is a circuit diagram illustrating a configuration of an insulated active electromagnetic interference (EMI) filter having no additional elements on a power line according to a first embodiment of the present disclosure. The first embodiment of the present disclosure includes a passive EMI filter composed of a common-mode (CM) choke 1100 and a Y-cap 1200 and an EMI filter 1000 composed of a sensing winding 1300, an amplifier 1400, and a transformer 1500.

The common-mode (CM) choke 1100 is disposed on a power source side from which power is supplied and has a form in which a live line and a neutral line, which are connected to an EMI source, are each wound with a winding.

The Y-cap 1200 is disposed on an EMI source side at which EMI occurs and includes two capacitors connected in series, and the two capacitors are connected in parallel between the live line L and the neutral line N and are commonly connected to the ground.

The sensing winding 1300 is formed by winding a coil on the CM choke 1100, and senses a noise current flowing through the CM choke 1100. When a capacitance of a parasitic circuit of the CM choke 1100 is referred to as $C_{cm}$, and a capacitance of a parasitic circuit of the sensing winding 1300 is referred to as $C_{sen}$, the number of turns $N_{sen}$ of the sensing winding 1300 may be less than a square root of $2C_{cm}/C_{sen}$.

The amplifier 1400 amplifies the noise current that is sensed through the sensing winding 1300.

The transformer 1500 is installed in front of the Y-CAP 1200, includes a primary coil that receives a signal amplified by the amplifier and a secondary coil that is isolated from the power line by being connected to the ground connected to the Y-cap 1200, and injects a signal of the secondary coil into the Y-cap 1200 as a compensation signal.

Figure 2:
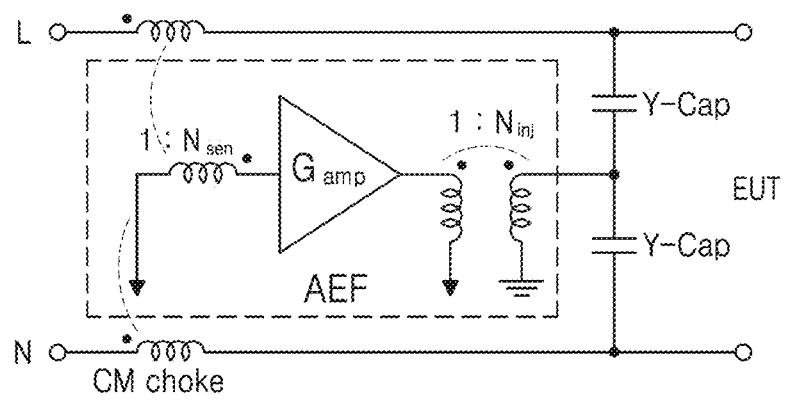
FIG. 2 is a diagram illustrating an example of the configuration of the active type EMI filter (REF) according to the present disclosure, and illustrates a configuration in which a proposed transformer-isolated AEF is installed on a common-mode (CM) L-C EMI filter in an add-on manner.
Figure 3:
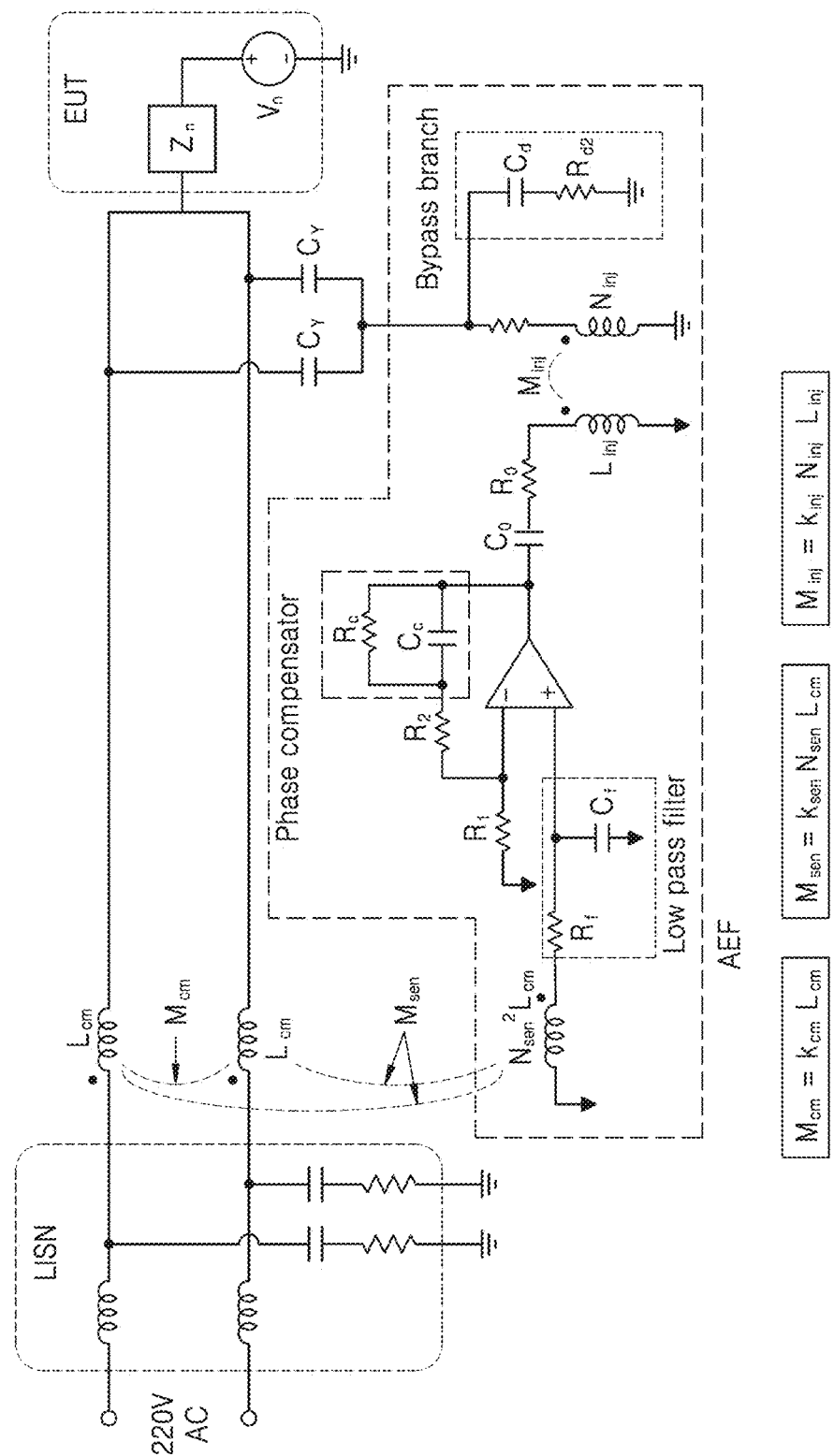
FIG. 3 illustrates a circuit model of an AEF according to one embodiment of the present disclosure.

FIG. 2 is a diagram illustrating an example of the configuration of the active type EMI filter (AEF) according to the present disclosure, and illustrates a configuration in which a proposed transformer-isolated AEF is installed on a CM L-C EMI filter in an add-on manner. FIG. 3 illustrates a circuit model of an AEF according to one embodiment of the present disclosure.

The isolated type active EMI filter having no additional elements on a power line according to the present disclosure may further include a low-pass filter to prevent stability problems that may be caused by resonance in the sensing winding in a high-frequency range. Referring to FIG. 3, the low-pass filter includes a resistor $R_f$ and a capacitor $C_f$.

One end of the resistor $R_f$ is connected to the sensing winding, and the other end thereof is connected to a positive input terminal of the amplifier. The capacitor $C_f$ has one end connected to the other end of the resistor $R_f$ and the positive input terminal of the amplifier and the other end connected the ground. The capacitor $C_f$ is located at the input terminal of the amplifier.

Further, an impedance $Z_{in}$ AEF viewed from the input terminal of the amplifier 1400 toward the low-pass filter may be set to be greater than an impedance $Z_{sen, para}$ of parasitic RC components of the sensing winding 1300 in a frequency range of interest.

A cutoff frequency $1/2^{\pi} R_f C_f$ of the low-pass filter may be greater than a maximum operating frequency $f_{op}$, max and less than a frequency of $1/2\sqrt{(1-k_{cm}^2)N_{sen}^2 L_{cm} C_{sen}}$ (where, $k_{sen}$ denotes a coupling coefficient of the sensing winding, $N_{sen}$ denotes the number of turns of the sensing winding 1300, $L_{cm}$ denotes an inductance of the CM choke 1100, and $C_{sen}$ denotes a capacitance of the parasitic circuit of the sensing winding 1300).

In addition, the isolated type active EMI filter having no additional elements on a power line according to the present disclosure may further include a bypass branch configured to serve as a bypass to avoid resonance in the transformer, increase stability by acting as a damping circuit, and mitigate performance degradation due to resonance between the Y-cap and an impedance of the EMI source. Referring to FIG. 3, the bypass branch may include a first resistor $R_{d1}$, a capacitor $C_d$, and a second resistor $R_{d2}$.

The first resistor $R_{d1}$ has one end connected to the Y-cap and the other end connected to the secondary coil of the transformer, and one end of the capacitor $C_d$ is connected to one end of the first resistor $(R_{d1})$. One end of the second resistor $R_{d2}$ is connected in series with the other end of the capacitor, and the other end thereof is connected to the ground.

Further, the isolated type active EMI filter having no additional elements on a power line according to the present disclosure may further include a phase compensator for stability in a low-frequency range.

Referring to FIG. 3, the phase compensator includes a resistor Rc and a capacitor Cc that are connected in parallel, and one ends of the resistor Rc and the capacitor Cc, which are connected in parallel, are connected to a negative input terminal of the amplifier, and the other ends of the resistor Rc and the capacitor Cc, which are connected in parallel, are connected to an output terminal of the amplifier.

The present disclosure proposes a novel structure of a fully transformer-isolated AEF. Referring to FIG. 2, the AEF according to one embodiment of the present disclosure is installed on the existing CM L-C EMI filter, which is composed of the CM-choke and the Y-cap, in an add-on manner. The structure of the AEF according to one embodiment of the present disclosure is similar to the topology of a conventional current-sense current-compensation (CSCC) AEF, but an injection transformer is added between the output terminal of the amplifier and the compensation Y-cap. The injection transformer is not installed on the main power line, so that only a compensation signal current having a small magnitude flows through the transformer. The injection transformer may be implemented in a small size because a small magnitude of current flows regardless of the operating current of an application program, so that the risk of magnetic saturation and thermal problems may be reduced. In addition, the sensing part of the AEF does not require an additional transformer, but a thin noise sensing line is additionally wound on an existing commercial CM choke. There was an attempt to add a sensing winding directly on the commercial CM choke, but the adverse effects of the sensing winding and the maximum allowable number of turns have not been examined. In summary, in terms of main novel features of the AEF according to one embodiment of the present disclosure, fully transformer-isolation may be achieved without the use of separate components on the main power line, and compact-sized design may be achieved. Due to these characteristics, the AEF according to the present disclosure is smaller in size and better in performance than other transformer-isolated CSVC AEFs.

In the present disclosure, a number of useful explicit design guidelines are provided for the complete design of the AEF according to one embodiment of the present disclosure. As will be described below, the transformer-isolated AEF is analyzed to evaluate a noise attenuation performance, appropriate design guidelines are provided for the performance and stability of the AEF on the basis of the analysis. In addition, filter insertion loss and loop gain of the AEF are measured using a vector network analyzer and verified. The reduction of CM conducted emission (CE) noise due to the AEF is also achieved in actual switched-mode power supply (SMPS) board products. In addition, the amount of current leaking to the ground is measured to confirm the safety of a use of the AEF.

An AEF according to one embodiment of the present disclosure will be analyzed. Referring to FIG. 3, $C_Y$ represents a capacitance of a Y-cap. A CM choke is modeled as Lcm and Mcm, which respectively represent a self-inductance and a mutual-inductance of a winding on a power line.

The AEF is mainly composed of a sensing winding wound on the CM choke, an amplifier, and an injection transformer. A turns ratio of the winding on the power line and the sensing winding is set to be $1:N_{sen}$, and a self-inductance of the sensing winding is given by about $N_{sen}^2 L_{cm}$. $M_{sen}$ represents a mutual-inductance between the winding on the power line and the sensing winding at an input terminal of the AEF. Similarly, $M_{inj}$ represents a mutual-inductance of an injection transformer, and in the injection transformer, a turns ratio of a primary winding and a secondary winding is set to be $1:N_{inj}$. Self-inductances of the primary winding and the secondary winding are respectively set to be $L_{inj}$ and $N_{inj}^2 L_{inj}$. $M_{cm}$, $M_{sen}$, and $M_{inj}$ are calculated by $k_{cm}L_{cm}$, $k_{sen}N_{sen}L_{cm}$, and $k_{inj}N_{inj}L_{inj}$, respectively. Here, $k_{cm}$, $k_{sen}$, and $k_{inj}$ represent coupling coefficients. Generally, in actual design, each of $k_{cm}$, $k_{sen}$, and $k_{inj}$ has a value in a range of 0.99 to 1. The amplifier is implemented as a configuration of a non-inverting operational-amplifier (OP-AMP) with resistors $R_1$ and $R_2$.

In consideration of a feedback stability of the AEF, as illustrated in FIG. 3, some additional components are required, such as a low-pass filter, a bypass branch, and a phase compensator. $R_f$ and $C_f$ constitute a low-pass filter for preventing stability problems in the OP-AMP, which may be caused by resonance in the sensing winding in a high-frequency range, Rd1, Cd, and Rd2 act as a bypass to avoid resonance in the injection transformer and operate as a damping circuit for securing stability, so that the performance degradation due to resonance between a noise source impedance and the Y-cap is further mitigated. $R_c$ and $C_c$ constitute a phase compensator for securing stability in the low-frequency range.

Figure 4:
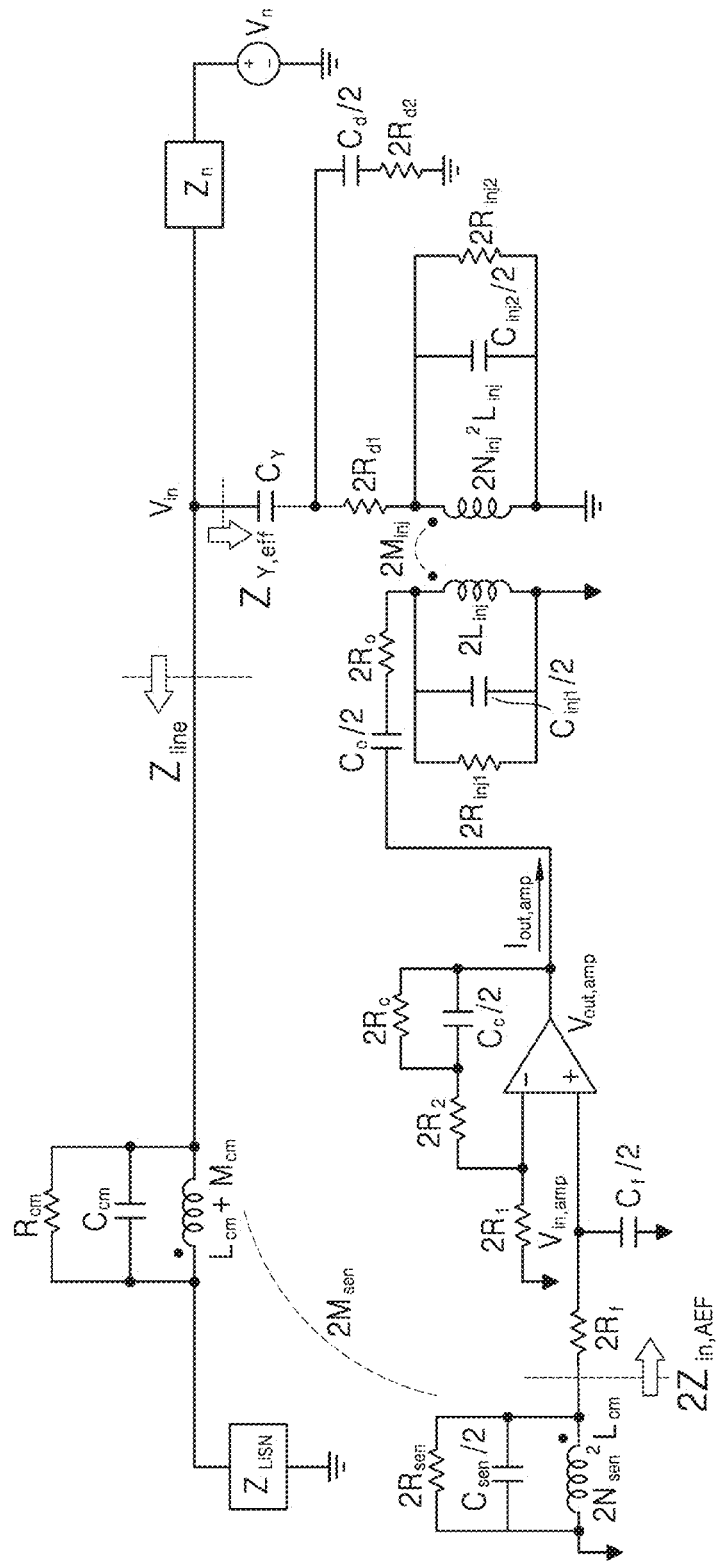
FIG. 4 illustrates an equivalent circuit for a half portion including parasitic components.

Even when a ground reference voltage of the AEF is set differently from the ground, the AEF is symmetric with respect to a zero alternating current (AC) potential, and a circuit may be divided into two portions and analyzed. FIG. 4 illustrates an equivalent circuit for a half portion including parasitic components. Referring to FIG. 4, in order to be expressed more accurately, parasitic circuit parameters of the CM choke, the sensing winding, and the injection transformer are also modeled and represented by $R_{cm}$ and $C_{cm}$, $R_{sen}$ and $C_{sen}$, and $R_{inj1}$, $C_{inj1}$, $R_{inj2}$, and $C_{inj2}$, respectively. A CM noise source of equipment under test (EUT) is modeled as $V_n$ and $Z_n$ of the Thevenin equivalent circuit, which respectively represent a CM noise source voltage and a CM noise source impedance. $Z_{LISN}$ represents an impedance of a line impedance stabilization network (LISN). $Z_{line}$, $Z_{in, AEF}$, and $Z_{Y, eff}$ each represent an impedance viewed in each direction with regard to the zero AC potential.

The operation principle of the AEF is analyzed on the basis of an equation expressing an effective inductance of the CM choke and an effective capacitance of a Y-cap branch. The effective inductance of the CM choke will be described.

An impedance viewed from a front end of the CM choke toward the power line is expressed using Kirchhoff's law and shown below, $$Z_{line} = (sL_{cm,eff}) \| R_{cm} \| \frac{1}{sC_{cm}} + Z_{LISN} \quad \text{[Equation 1]}$$

where, $$L_{cm,eff}(s) = (1 + k_{cm} - X(s))L_{cm} \quad \text{[Equation 2]}$$

$$X(s) = \frac{2M_{sen}I_{sen}}{L_{cm}I_{cm}} = \frac{2sk_{sen}^2 N_{sen}^2 L_{cm}}{sN_{sen}^2 L_{cm} + Z_{in,AEF} \| Z_{sen,para}} \quad \text{[Equation 3]}$$

$$Z_{sen,para} = R_{sen} \| \frac{1}{sC_{sen}} \quad \text{[Equation 4]}$$

$$Z_{in,AEF} \approx R_f + \frac{1}{sC_f} \quad \text{[Equation 5]}$$

where, $L_{cm,eff}$ represents the effective inductance of the CM choke, and here, an inductance cancellation item $X(s)$ appears. $X(s)$ is defined as $(2M_{sen}I_{sen})/(L_{cm}I_{cm})$, where $I_{cm}$ and $I_{sen}$ represent currents flowing through inductance branches of $L_{cm}/M_{cm}$ and $2N_{sen}^2 L_{cm}$ shown in FIG. 4, respectively. $Z_{sen, para}$ represents an impedance of parasitic RC components of the sensing winding. $Z_{in, AEF}$ represents an impedance viewed from the input terminal of the amplifier toward the low-pass filter. An input impedance of the OP-AMP is assumed to be great in a frequency range of interest and is ignored in Equation 5.

Figure 5:
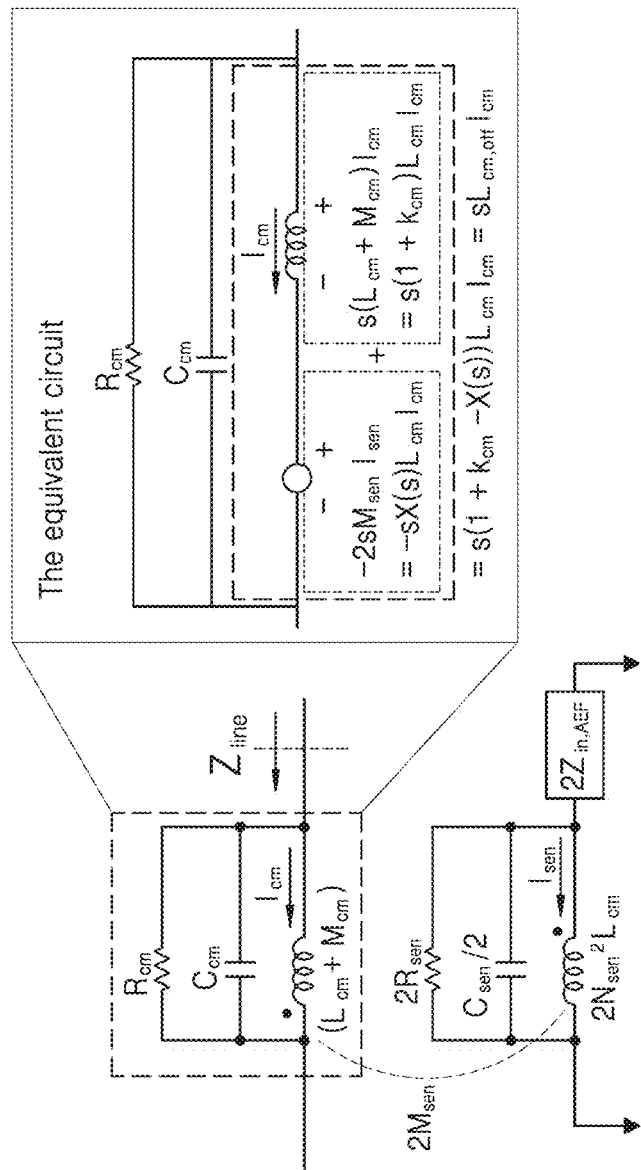
FIG. 5 illustrates an equivalent circuit model, which includes the influence of a sensing winding, of a CM choke on the power line.

FIG. 5 illustrates an equivalent circuit model, which includes the influence of the sensing winding, of the CM choke on the power line. The effect of the sensing winding on the inductance of the CM choke is summarized in FIG. 5. Referring to FIG. 5, a box on the right side of the drawing illustrates the equivalent circuit model of the CM choke on the power line in consideration of a voltage induced by $2M_{sen}$. The induced voltage of $2sM_{sen}I_{sen}$ has a polarity opposite to that of a voltage drop of $s(L_{cm}+M_{cm})I_{cm}$. A total voltage with respect to the choke inductance may be simplified as $s(1+k_{cm}-X(S))L_{cm}I_{cm}$ when $X(s)$ is defined as $(2M_{sen}I_{sen})/(L_{cm}I_{cm})$. Thus, an effective inductance $L_{cm, eff}$ of the CM choke is expressed as $(1+k_{cm}-X(s))L_{cm}$ given in Equation 2.

In the absence of the sensing winding, $k_{sen}=X(s)=0$, and thus $L_{cm, eff}$ is simply given by $(1+K_{cm})L_{cm}$. However, in Equation 3, when $sN_{sen}^2 L_{cm}$ is much greater than $(Z_{in, AEF} \| Z_{sen, para})$, $K_{cm}$ and $K_{sen}$ are very close to one (1), and thus $X(s) \approx 2k_{sen}^2$, and $L_{cm, eff} \approx L_{cm}(1+k_{cm}-2k_{sen}^2)$. This means that the choke inductance may be critically affected by the current flowing through the sensing winding. Thus, in order to maintain the value of the choke inductance, the number of turns $N_{sen}$ of the sensing winding should be limited.

Next, the effective capacitance of the Y-cap will be described. An impedance viewed in a direction of a branch $Z_{Y, eff}$ of the Y-cap may be expressed as in Equations 6 to 11 below, $$Z_{Y,\mathit{eff}}(s) = \frac{1}{sC_Y} \cdot \frac{1+\beta(s)}{1+\alpha(s)}$$ [Equation 6]

where, $$\alpha(s) = sk_{inj}N_{inj}L_{inj}G_1(s)G_{amp}(s) \cdot$$ [Equation 7]

$$\frac{\left(R_{d2}+\frac{1}{sC_d}\right)\left(R_{inj1}\|\frac{1}{sC_{inj1}}\right)\left(R_{inj2}\|\frac{1}{sC_{inj2}}\right)}{\left\{R_{d1}+R_{d2}+\frac{1}{sC_d}+R_{inj2}\|\frac{1}{sC_{inj2}}\right\}\left(R_o+\frac{1}{sC_o}+R_{inj1}\|\frac{1}{sC_{inj1}}\right)A(s)}$$

$$\beta(s) = sC_T\left(R_{d1}+R_{inj2}\|\frac{1}{sC_{inj2}}\right)\left(R_{d2}+\frac{1}{sC_d}\right)\times\left[1-\right.$$ [Equation 8]

$$\frac{\left(R_{inj2}\|\frac{1}{sC_{inj2}}\right)^2}{\left(R_{d1}+R_{inj2}\|\frac{1}{sC_{inj2}}\right)A(s)}\frac{R_{d2}+\frac{1}{sC_d}}{R_{d1}+R_{d2}+\frac{1}{sC_d}+R_{inj2}\|\frac{1}{sC_{inj2}}}$$

$$\left\{\frac{\left(R_{inj1}\|\frac{1}{sC_{inj2}}\right)^2}{R_o+\frac{1}{sC_o}+R_{inj1}\|\frac{1}{sC_{inj1}}} - R_{inj2}\|\frac{1}{sC_{inj1}} - sL_{inj}\right\}\Bigg]$$

$$G_1(s) = \frac{V_{in,amp}}{V_{in}} =$$ [Equation 9]

$$-\frac{2sk_{sen}N_{sen}L_{cm}Z_{sen,para}}{sN_{sen}^2L_{cm}+Z_{sen,para}\|Z_{in,AEF}}\frac{\frac{1}{sC_f}}{R_f+\frac{1}{sC_f}+Z_{sen,para}}\frac{R_{cm}\|\frac{1}{sC_{cm}}-Z_{line}-Z_{LISN}}{\left(R_{cm}\|\frac{1}{sC_{cm}}\right)Z_{line}}$$

$$G_{amp}(s) = \frac{V_{out,amp}}{V_{in,amp}} = 1 + \frac{R_2+R_c\|\frac{1}{sC_c}}{R_t}$$ [Equation 10]

$$A(s) = \left\{\frac{\left(R_{inj1}\|\frac{1}{sC_{inj1}}\right)^2}{R_d+\frac{1}{sC_o}+R_{inj1}\|\frac{1}{sC_{inj1}}} - R_{inj1}\|\frac{1}{sC_{inj1}} - sL_{inj}\right\}\left\{sN_{inj}^2L_{inj} + \right.$$ [Equation 11]

$$\left.\left(R_{d1}+R_{d2}+\frac{1}{sC_d}\right)\|R_{inj2}\|\frac{1}{sC_{inj2}}\right\} + (sk_{inj}N_{inj}L_{inj})^2$$

where; α(s) and β(s) may be physically expressed as a boosting factor and a bypass factor, respectively, as described below. $G_1(S)$ is a voltage gain from $V_{in}$ to $V_{in,amp}$, and $G_{amp}(s)$ is a gain of the amplifier from $V_{in,amp}$ to $V_{out,amp}$. It is assumed that a frequency bandwidth of the OP-AMP is sufficiently higher than a frequency range of interest. In Equation 6, the expression of $Z_{Y,eff}$ may be understood as an impedance of an effective capacitance $C_{Y,eff}(s)$, and is defined by Equation 12 below, $$C_{Y,\mathit{eff}}(s) = C_Y\frac{1+\alpha(s)}{1+\beta(s)}.$$ [Equation 12]

Figure 6A:
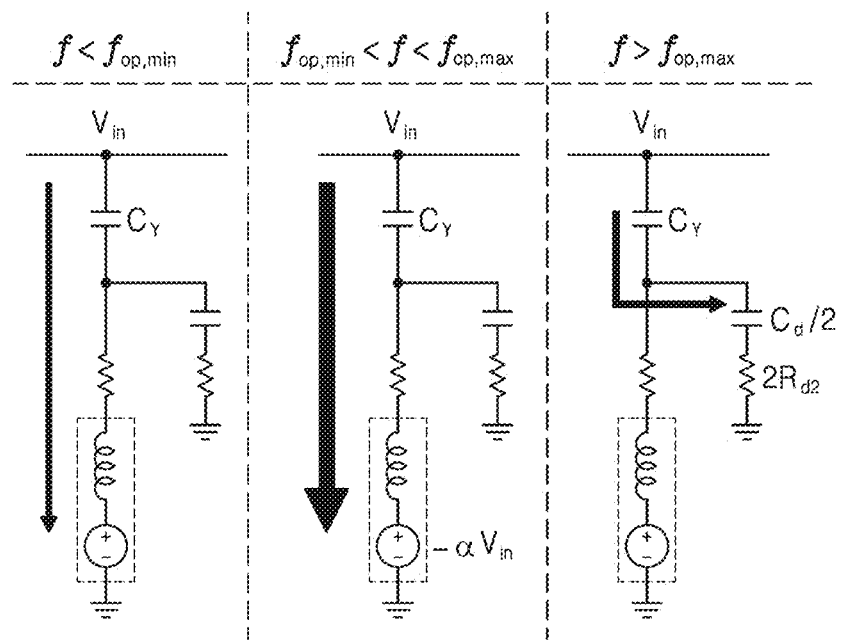
FIGS. 6A, 6B, and 6C illustrate changes in current paths and a capacitor effect $C_{Y,\,eff}(s)$ of a Y-cap due to the AEF for each frequency range.
Figure 6B:
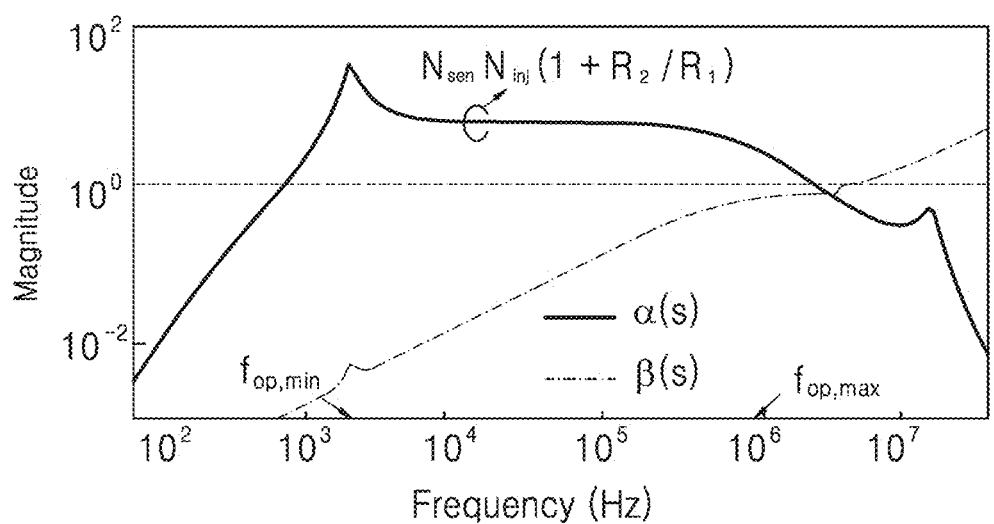
Figure 6C:
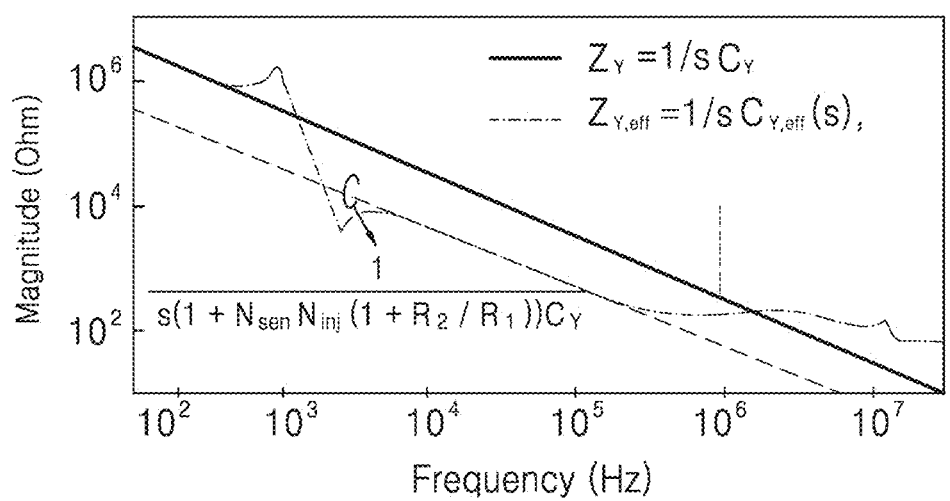

FIGS. 6A, 6B, and 6C illustrate changes in $C_{Y,eff}(s)$ according to the change in frequency, and here, FIG. 6A illustrates the operation of the AEF in the frequency range of interest, FIG. 6B is a plot of α(s) and β(s), and FIG. 6C illustrates an impedance curve of $Z_{Y,eff}$.

The changes of $C_{Y,eff}(s)$ according to the change in frequency are summarized in FIGS. 6A, 6B, and 6C. The effect of the AEF on the Y-cap branch and the change in a path of the current are illustrated in FIG. 6A. A dotted box shows the effect of the AEF on $C_{Y,eff}$. $f_{op,min}$ and $f_{op,max}$ are minimum and maximum target operating frequencies of the AEF, respectively, that may be designed as circuit parameters of the REF.

For example, a magnitude of each of α(s) and β(s) of the appropriately designed AEF is plotted according to the frequency in FIG. 6B. The impedance $Z_{Y,eff}$ of the Y-cap branch is also plotted in FIG. 6C. α(s) and β(s) are both much less than one (1) at frequencies that are sufficiently lower than $f_{op,min}$, and thus $Z_{Y,eff}$ in equation 6 is simply approximated by $1/sC_Y$. This means that the bypass circuit and the injection transformer are negligible compared to the impedance of $C_Y$, and a noise voltage, which is compensated for by the AEF, is also very small. In the operating frequency range of the AEF, which is from $f_{op,min}$ to $f_{op,max}$, a(s) is greater than one, but β(s) is still much less than one. That is, as indicated by −αV in in FIG. 6A, the AEF provides a compensation voltage to the Y-cap branch, while the bypass circuit is still negligible.

The magnitude of α(s) is mainly maintained at $N_{sen}N_{inj}$ $(1+R_2/R_1)$ that is a multiplication of the voltage gains of the sensing winding, the amplifier, and the injection transformer in the operating frequency range. Accordingly, the CM current flowing through the Y-cap branch is amplified by $(1+N_{sen}N_{inj}(1+R_2/R_1))$ so that the effective capacitance is increased to $(1+N_{sen}N_{inj}(1+R_2/R_1))C_Y$ as illustrated in FIG. 6C. As the frequency increases closer to $f_{op,\,max}$, $\alpha(s)$ begins to decrease, which indicates that the compensation voltage from the AEF decreases. At the same time, $\beta(s)$ becomes similar to one (1), which means that an impedance $R_{d2+1}/sC_d$ of the bypass branch is less than an impedance of a path of the injection transformer. Thus, a CM noise current flows mainly through the bypass branch, and the impedance $Z_{Y,eff}$ is approximated by $(1/sC_Y+2(R_{d2}+1/sC_d))$.

FIG. 6C illustrates that the magnitude of $Z_{Y,eff}$ is increased to be greater than the magnitude of $1/sC_Y$ since $C_d$ and $R_{d2}$ are added to the current path in the frequency range after $f_{op,max}$. However, a damping resistor $R_{d2}$ plays an important role in mitigating resonance between the Y-cap and the CM noise source impedance. The resonance should be avoided as the performance of the entire CM filter is often greatly degraded due to resonance.

Next, the insertion loss (IL) of the entire filter will be described. The noise reduction performance of the filter is generally quantified as the IL, which is defined as a ratio of a noise voltage received by the LISN in a state in which the filter is not installed, to a noise voltage received by the LISN in a state in which the filter is installed. In FIG. 4, the IL of the entire EMI filter is derived as shown in Equation 13 below, $$IL = \frac{Z_{line} \| Z_{Y,eff} + 2Z_n}{Z_{line} \| Z_{Y,eff}} \frac{Z_{line}}{2Z_n + Z_{LISN}}. \qquad \text{[Equation 13]}$$

As the frequency increases, the IL in Equation 13 begins to increase mainly at a frequency point in which $Z_{Y,\,eff}$ is less than $Z_{line}$. A low frequency boundary in the filter operation may be approximated to $\frac{1}{2}\sqrt{L_{cm,eff}C_{Y,eff}}$. As shown in FIG. 6C, the proposed AEF greatly reduces the $Z_{Y,\,eff}$ in the target frequency range, which increases the IL of the entire filter. Further, the AEF causes the entire filter to start operating at a lower frequency.

Meanwhile, the design guidelines of the AEF provided in the present disclosure will be described. The actual design guidelines for the AEF are developed in consideration of performance and stability. First, the design of the sensing winding and the input low-pass filter is described.

The sensing winding is wound directly on the CM choke so that no separate sensing transformer is added. It is preferable not to use a separate sensing transformer in terms of size and costs. However, as described above, the inductance $L_{cm,eff}$ of the CM choke and the impedance $Z_{line}$ of the power line may be reduced due the additional sensing winding. Although the AEF according to the present disclosure properly increases $C_{Y,\,eff}$ of the Y-cap, the reduced impedance $Z_{line}$ of the power line may degrade the noise attenuation performance of the entire CM EMI filter. Thus, in order to prevent $Z_{line}$ from being reduced, an appropriate design guideline for the sensing winding is required.

$Z_{line}$ is determined mainly by the parasitic capacitance after a first magnetic resonance frequency $f_{r,\,cm}$ (given as $(\frac{1}{2\pi}\sqrt{L_{cm,eff}C_{cm}})$) of the CM choke. Accordingly, after the frequency $f_{r,\,cm}$, the inductance cancellation item $X(s)$ has no significant influence on the magnitude of $Z_{line}$. In addition, $X(s)$ in Equation 3 is meaningful only when $sN_{sen}^2L_{cm}$ is greater than $(Z_{in,AEF}\|Z_{sen,para})$. Thus, when a frequency point, at which the $sN_{sen}^2L_{cm}$ starts to be greater than $(Z_{in,AEF}\|Z_{sen,para})$, is higher than $f_{r,cm}$, $Z_{line}$ is hardly affected by the sensing winding. Such a condition may be satisfied by the following design procedure. First, $Z_{in,AEF}$ is designed to be greater than $Z_{sen,\,para}$ at all frequency ranges of interest (e.g., 10 kHz to 30 MHz). That is, it may be expressed by a condition shown in Equation 14 below, $$\left(Z_{in,AEF} = R_f + \frac{1}{sC_f}\right) > \left(Z_{sen,para} = R_{sen} \| \frac{1}{sC_{sen}}\right) \qquad \text{[Equation 14]}$$

where, $R_f$ and $C_f$ are selected to be as in Equations 15 and 16 in order to be expressed more simply, $$R_f > \frac{1}{sC_{sen}} \qquad \text{[Equation 15]}$$

$$C_f < C_{sen}. \qquad \text{[Equation 16]}$$

When an inequality condition in Equation 14 is sufficiently satisfied, $(Z_{in,\,AEF}\|Z_{sen,\,para}) \approx Z_{sen,\,para}$. Then, the frequency point at which $sN_{sen}^2L_{cm}$ starts to be greater than $(Z_{in,AEF}\|Z_{sen,para})$ is approximated to a resonant frequency between $N_{sen}^2L_{cm}$ and $C_{sen}$, which is shown in Equation 17 below, $$f_{r,sen} = \frac{1}{2\pi N_{sen}\sqrt{L_{cm}C_{sen}}} \qquad \text{[Equation 17]}$$

here, $f_{r,sen}$ should be higher than km as shown in Equation 18 below, $$\left(f_{r,sen} = \frac{1}{2\pi N_{sen}\sqrt{L_{cm}C_{sen}}}\right) > \left(f_{r,cm} = \frac{1}{2\pi\sqrt{L_{cm,eff}C_{cm}}}\right) \qquad \text{[Equation 18]}$$

so that the design guideline for the number of turns of the sensing winding is extracted as shown in Equation 19 below, $$N_{sen} < \sqrt{\frac{L_{cm,eff}C_{cm}}{L_{cm}C_{sen}}} \approx \sqrt{\frac{2C_{cm}}{C_{sen}}} \qquad \text{[Equation 19]}$$

where, $L_{cm,eff}$ is approximated as $(1+k_{cm})L_{cm} \approx 2L_{cm}$. The design guideline for Equation 19 in which the maintained $Z_{line}$ is guaranteed is derived by the maximum allowable winding ratio of the sensing winding. The exact values of the parasitic capacitances of the CM choke, $C_{cm}$, and $C_{sen}$ in Equation 19 are not known before being actually designed, but Equation 19 may still provide a useful guideline for the number of turns of the sensing winding.

Figure 7A:
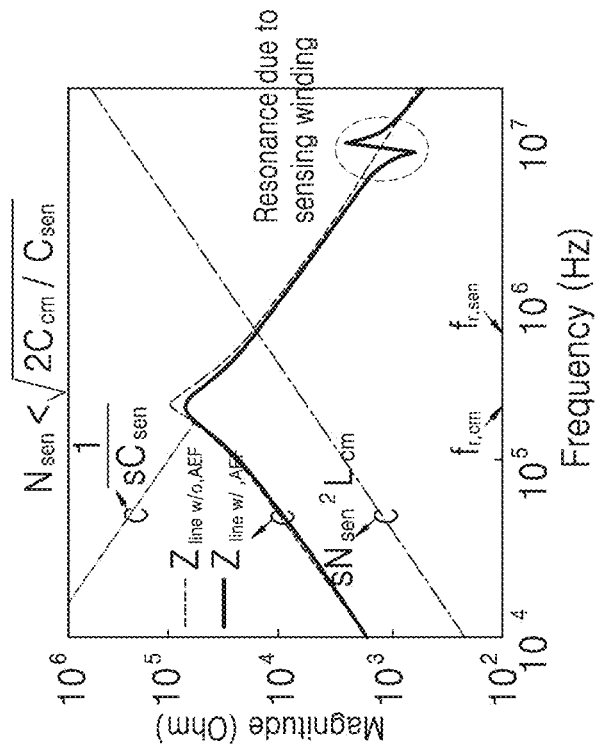
Figure 7B:
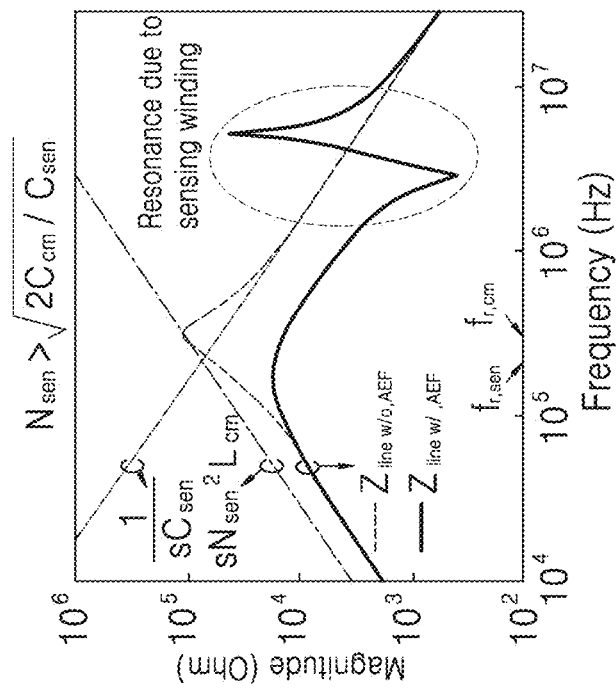

FIGS. 7A and 7B are graph as illustrating curves of the impedance $Z_{line}$ of the power line when viewed from the position of the Y-cap toward the power source, wherein FIG. 7A is a graph illustrating the curve in a case in which $N_{sen}$ violates Equation 19, and FIG. 7B is the graph illustrating the curve in a case in which $N_{sen}$ satisfies Equation 19. Examples of values are illustrated in FIG. 7. Two different values of $N_{sen}$ are tested with AEF designed by setting $C_{cm}$ and $C_{sen}$ to the same fixed value for the simple analysis. The magnitudes of the $Z_{line}$ in the case in which the AEF is included and the case in which the AEF is not included, that is, $Z_{line\ w/,\ AEF}$ and $Z_{line\ w/o,\ AEF}$ are compared and illustrated. In FIG. 7A, the condition of Equation 19 is violated since $N_{sen}=2$, and $f_{r,\ sen}$ is lower than $f_{r,\ cm}$. In contrast, Equation 19 satisfies FIG. 7B as $N_{sen}=0.5$, and $f_{r,sen}$ is higher than $f_{r,\ cm}$. As a result, in FIG. 7A, $Z_{line,\ w/AEF}$ is significantly reduced as compared with $Z_{line,\ w/o\ AEF}$, while in FIG. 7B, $Z_{line,\ w/AEF}$ is substantially unchanged.

Further, when the AEF is used, in a high-frequency region, another resonance occurs in $Z_{line}$. The resonance occurs due to the sensing winding in a frequency of $\frac{1}{2}\pi\sqrt{(1-k_{sen}^2)N_{sen}^2L_{cm}C_{sen}}$ as illustrated in FIGS. 7A and 7B. Since the resonance adversely affects the stability of the system feedback in the high-frequency range, a low-pass filter composed of $R_f$ and $C_f$ is required at the input terminal of the OP-AMP to suppress the resonance. In the case of the low-pass filter that does not affect the performance of the AEF in the operating frequency range, a cutoff frequency of the filter should be higher than $f_{op,\ max}$, which is the maximum operating frequency, but lower than a resonant frequency in Equation 20 below, $$f_{op,max} < \frac{1}{2\pi R_f C_f} < \frac{1}{2\pi\sqrt{(1-k_{sen}^2)N_{sen}^2L_{cm}C_{sen}}}. \quad \text{[Equation 20]}$$

Equation 15, Equation 16, and Equation 20 may be guidelines for designing the low-pass filter.

Next, the design of the injection transformer and the amplifier will be described.

The design of the injection transformer and the amplifier is mainly to determine the main performance parameters $f_{op,\ min}$, $f_{op,max}$, and $C_{Y,eff}$ of the AEF in FIG. 6. A capacitor $C_o$ at an output terminal of the amplifier is used to prevent unwanted signals at frequencies lower than the target operating frequency range. $L_{in}$ and $C_o$ connected in series with $L_{inj}$ constitute a high-frequency filter, and a cutoff frequency of the high-frequency filter determines a minimum operating frequency of the AEF by being derived as in Equation 21 below, $$f_{op,min} = \frac{1}{2\pi\sqrt{L_{inj}C_o}}. \quad \text{[Equation 21]}$$

An impedance of $C_o$ connected in series with $L_{inj}$ is rapidly decreased at a frequency $f_{op,\ min}$ to increase an output current of the OP-AMP. Thus, $R_o$ should be added to the output terminal of the OP-AMP in order to limit the impedance at the resonant frequency, but should be sufficiently less than $sL_{inj}$ in all operating frequency ranges.

Meanwhile, as described with reference to FIG. 6A, the maximum operating frequency $f_{op,\ max}$ of the AEF is determined by a frequency boundary at which the impedance of the bypass branch is less than the impedance of the path of the injection transformer. Since resonance in the secondary winding of the injection transformer may cause feedback instability similar to the resonance due to the sensing winding illustrated in FIG. 7, the bypass branch should start to operate at a frequency lower than the resonant frequency. The resonance in the secondary winding occurs at a frequency of $\frac{1}{2}\pi\sqrt{(1-k_{inj}^2)N_{inj}^2L_{inj}C_{inj2}}$, which is higher than $f_{op,\ max}$, as shown in Equation 22 below, $$f_{op,max} < \frac{1}{2\pi\sqrt{(1-k_{inj}^2)N_{inj}^2L_{inj}C_{inj2}}} \quad \text{[Equation 22]}$$

where, $f_{op,\ max}$ is determined as in Equation 23 below due to resonance between $(1-k_{inj}^2)N_{inj}^2L_{inj}$, which is an inductance part of the injection transformer, and the capacitance $C_d$ of the bypass branch, $$f_{op,max} = \frac{1}{2\pi\sqrt{(1-k_{inj}^2)N_{inj}^2L_{inj}C_d}}. \quad \text{[Equation 23]}$$

When Equation 23 is put into Equation 22, the relationship between $C_d$ and $C_{inj}^2$ is extracted as in Equation 24 below, $$C_d > C_{inj2}. \quad \text{[Equation 24]}$$

Some damping resistors $R_{d1}$ and $R_{d2}$ are required for stability at high frequencies. $R_{d2}$ of tens of ohms is recommended in terms of mitigating the resonance between Y-cap and CM noise source impedance in the high-frequency range, which will be shown in experiments below.

Assuming that the effect of resistors $R_{d1}$, $R_{d2}$, and $R_{inj}^2$ is negligible in the AEF operation at a frequency range excluding the resonance point, the condition of Equation 24 allows Equations 7 to 11 to be approximated as in Equation 25 below in a frequency range up to $f_{op,\ max}$, $$\alpha(s) \approx N_{sen}N_{inj}G_{amp}(s), \beta(s) \approx 0. \quad \text{[Equation 25]}$$

The effective capacitance $C_{Y,\ eff}(s)$ of the Y-cap in Equation 12 is simplified as Equation 26 below, $$C_{Y,eff}(s) \approx (1+N_{sen}N_{inj}G_{amp}(s))C_Y. \quad \text{[Equation 26]}$$

Phase compensation elements $R_c$ and $C_c$ of $G_{amp}(s)$ should have little effect on the AEF operation, and Equation 26 is further simplified to a value that does not depend on the frequency as in FIG. 6.

$$C_{Y,eff} \approx (1+N_{sen}N_{inj}(1+R_2/R_1))C_Y. \quad \text{[Equation 27]}$$

Finally, several useful design guidelines for the AEF may be derived as follows. Although $N_{sen}$ is limited by Equation 19, in Equation 27, $C_{Y,\ eff}$ may be designed to be several times $C_Y$ by increasing $N_{inj}$ and gain $(1+R_2/R_1)$ of the amplifier. However, as $N_{inj}$ increases, the maximum operating frequency $f_{op,\ max}$ is reduced due to Equation 23. Further, the high amplifier gain also requires a high output voltage swing and a high gain bandwidth for the OP-AMP. Thus, appropriate values of $N_{inj}$ and $(1+R_2/R_1)$ should be selected in consideration of costs of the OP-AMP and $f_{op,\ max}$ of the AEF.

Further, the condition of Equation 22 also means that $f_{op,\ max}$ of the AEF may be adjusted by $N_{inj}$, $L_{inj}$, and $C_{inj}^2$ of the injection transformer. Since the parasitic capacitance $C_{inj2}$ is not an independent design parameter, $N_{inj}$ and $L_{inj}$ should be designed to be small to achieve high $f_{op,\ max}$. However, small $N_{inj}$ reduces $N_{inj}C_{Y,\ eff}$, and when $L_{inj}$ is reduced, $f_{op\ min}$ is increased in Equation 21. As a result, in order for the AEF to have optimized performance, the following design process is proposed. First, $C_o$ is designed to have a high value that is allowed in a physical package of a given size, and $L_{inj}$ is lowered to the limit of Equation 21 for the target $f_{op\ min}$. Next, in order to achieve the highest $C_{Y,\ eff}$, $N_{inj}$ is increased to the limit of equation 22 for the target $f_{op\ max}$.

Next, a stability check will be described.

The AEF is basically a feedback system with an analog input and an analog output and thus items related to stability should be carefully designed, and the stability should be guaranteed. When the system is unstable, the system may oscillate even when an EUT noise source is not applied. The feedback stability may be confirmed by the phase and gain margin of the loop gain. In order to derive the loop gain from the circuit model of FIG. 4, the feedback loop is separated from the output terminal of the OP-AMP, and a test voltage source $V_t$ is applied from the separated node to the injection transformer, and in a state in which the noise source voltage $V_n$ is not applied, a ratio of the voltage $V_{in}$ at a front end node of the CM choke to a test voltage $V_t$ may be calculated as in Equation 28 below,

[Equation 28]

$$G_1(s) = \frac{V_{in}}{V_t} = \frac{sk_{inj}N_{inj}L_{inj}\left(R_{inj1} \parallel \frac{1}{sC_{inj1}}\right)\left(R_{inj2} \parallel \frac{1}{sC_{inj2}}\right)}{\left\{\left(R_o + \frac{1}{sC_o} + R_{inj} \parallel \frac{1}{sC_{inj}}\right)\left(sL_{inj} + \left(R_o + \frac{1}{sC_o}\right) \parallel R_{inj} \parallel \frac{1}{sC_{inj}}\right)\right\}} \cdot \frac{R_{d2} + \frac{1}{sC_d}}{\left(\frac{1}{Z_{in}} + \frac{1}{Z_{line}}\right)\left(R_{d1} + R_{d2} + \frac{1}{sC_d} + R_{inj2} \parallel \frac{1}{sC_{inj2}}\right)B(s)}$$

where,

[Equation 29]

$$B(s) = \left\{\left(\frac{1}{Z_{in}} + \frac{1}{Z_{line}}\right)^{-1} + Z_{Cy} + 2\left(R_{d2} + \frac{1}{sC_d}\right) \parallel (R_{d2} + R_{inj2} \parallel \frac{1}{sC_{inj2}})\right\} \times$$

$$\left(sN_{inj}^2 L_{inj} + \left(R_{inj2} \parallel \frac{1}{sC_{inj2}}\right) \parallel \left(R_{d1} + R_{d2} + \frac{1}{sC_d}\right) - \frac{(sM_{inj})^2}{sL_{inj} + \left(R_o + \frac{1}{sC_o}\right) \parallel (R_{inj1} \parallel \frac{1}{sC_{inj1}})}\right) -$$

$$\frac{2\left(R_{inj2} \parallel \frac{1}{sC_{inj2}}\right)^2 \left(R_{d2} + \frac{1}{sC_d}\right)^2}{\left(R_{d2} + R_{inj2} \parallel \frac{1}{sC_{inj2}} + R_{d2} + \frac{1}{sC_d}\right)^2}.$$

The voltage gains of $(V_{in,\,amp}/V_{in})$ and $(V_{out,\,amp}/V_{in,\,amp})$ are derived as $G_1(s)$ and $G_{amp}(s)$ in Equations 9 and 10, respectively. Thus, the loop gain of the system may be expressed as in Equation 30 below,

[Equation 30]

$$G_{loop}(s) = -\frac{V_{out,amp}}{V_t} = -\frac{V_{in}}{V_t}\frac{V_{in,amp}}{V_{in}}\frac{V_{out,amp}}{V_{in,amp}} = -G_1(s)G_2(s)G_{amp}(s).$$

The purpose of using $R_c$ and $C_c$ is to increase a phase margin of $G_{loop}(s)$ for ensuring stability in the low-frequency range because the resonance between the effective inductance $L_{cm,\,eff}$ of the choke and the effective capacitance $C_{Y,\,eff}$ of the Y-cap branch causes a risk of instability. A resonant frequency of $1/2\pi\sqrt{L_{cm,eff}C_{Y,eff}}$ determines the low frequency boundary of the filter operation and should be lower than a low-frequency limit of the CE specification in the appropriate EMI filter design. A maximum amount of phase compensation due to $R_c$ and $C_c$ is calculated by Equation 31 below,

[Equation 31]

$$\max(|\angle G_{loop,w/comp}(f) - \angle G_{loop,w/o\,comp}(f)|) =$$

$$\tan^{-1}\left(\sqrt{\frac{R_c^2}{4(R_1+R_2)(R_1+R_2+R_c)}}\right)$$

where, Equation 31 is obtained in a frequency of $$\frac{1}{2\pi R_c C_c}\sqrt{1 + \frac{R_c}{R_1+R_2}}.$$

Here, $\angle G_{loop,w/comp}(S)$ represents a phase of $G_{loop}(s)$ with the phase compensator, and $\angle G_{loop,w/pcomp}(S)$ represents the phase of the $G_{loop}(s)$ without the phase compensator. By setting the frequency for the maximum phase compensation as the resonant frequency of $1/2\pi\sqrt{L_{cm,eff}C_{Y,eff}}$, other expressions in $R_c$ and $C_c$ are extracted as in Equation 32 below,

[Equation 32]

$$C_c = \frac{1}{R_c}\sqrt{L_{cm,eff}C_{Y,eff}\left(1 + \frac{R_c}{R_1+R_2}\right)}.$$

The expressions in Equations 31 and 32 provide design guidelines for $R_c$ and $c_c$.

It should be noted that since $G_2(s)$ in Equation 28 differs depending on the EUT noise source impedance $Z_n$, the loop gain of Equation 30 also differs depending on the EUT noise source impedance $Z_n$. It can be seen that, in Equation 30, as the magnitude of $Z_n$ increases, the value of the loop gain increases, so that the gain margin tends to decrease. Thus, designing stability with an infinite value of $Z_n$ is generally to provide stability at worst-case conditions. Accordingly, in the present specification, the designed loop gain of the AEF is calculated or measured under the condition of the infinite value of $Z_n$ in order to ensure stability in any EUT application.

Figures 8A, 8B:
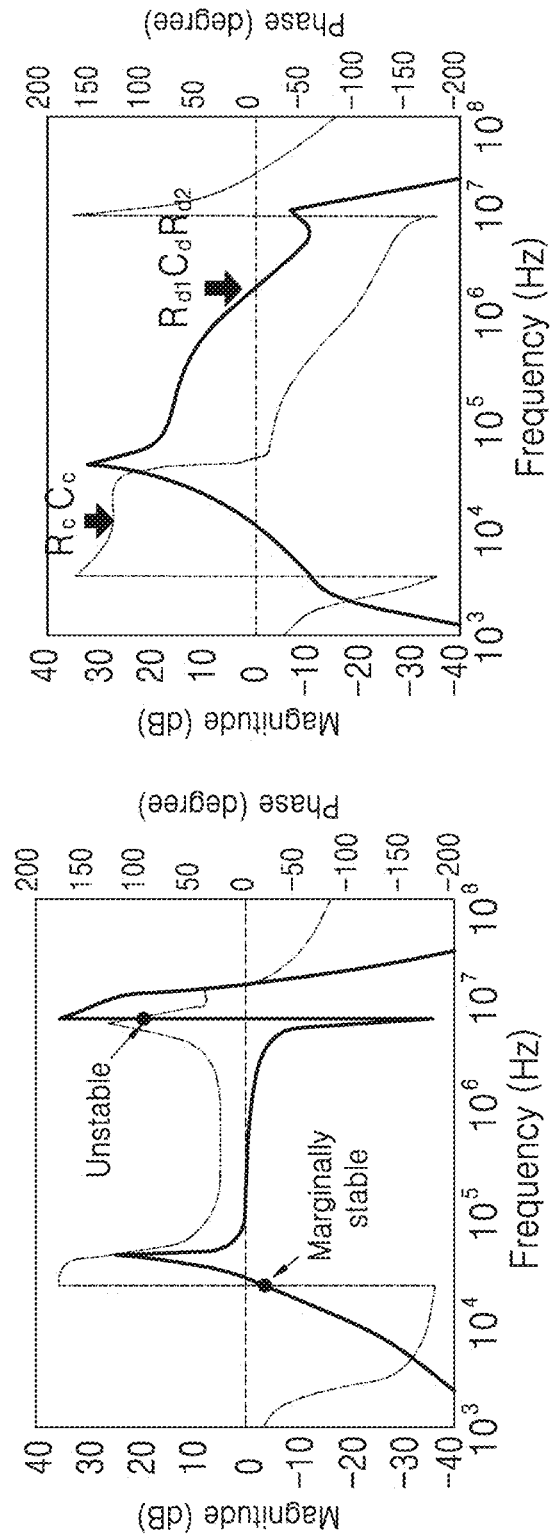

FIGS. 8A and 8B illustrate the comparison of loop gains, wherein FIG. 8A illustrates the loop gain in an unstable situation without the damping components $R_{d1}$, $C_d$, and $R_{d2}$ and the phase compensator of $R_c$ and $C_c$, and FIG. 8B illustrates the loop gain in a stable situation with the damping components $R_{d1}$, $C_d$, and $R_{d2}$ and the phase compensator of $R_c$ and $C_c$.

For example, $G_{loop}(s)$ of the filter with the AEF may be expressed using Equation 30 as shown in FIG. 8. The bypass branch and phase compensator of $R_{d1}$, $C_d$, $R_{d2}$, $R_c$, and $C_c$ are not installed in FIG. 8A, but are installed in FIG. 8B. The effect of these components on the stability is clearly illustrated. In FIG. 8A, the instability due to an abrupt phase shift in the vicinity of 10 MHz is caused by the secondary winding of the injection transformer, and is solved by the bypass branch in the case of FIG. 8B. In FIG. 8A, the resonance between $L_{cm,\ eff}$ and $C_{Y,\ eff}$ at a low frequency of less than 100 kHz also leads to the risk of excessive phase shift and instability. As can be seen from FIG. 8B, when the phase compensator of $R_c$ and $C_c$ is used, the gain margin is greatly increased.

Next, the selection of OP-AMP and the overall design procedure will be described. In the non-inverting amplifier, an operational frequency limit $f_{OPamp}$ of the OP-AMP should be higher than a high-frequency limit $f_{CE,\ max}$ of the CE specification.

$$f_{OPamp} > f_{CE,max}. \qquad \text{[Equation 33]}$$

Further, the voltage and current capacity of the OP-AMP should be sufficient to compensate for noise. In order to estimate the required OP-AMP capacity, a voltages $V_{out,\ amp}(s)$ and a current $I_{out,\ amp}(s)$ at the output terminal of the OP-AMP are calculated as shown in Equations 34 and 35, respectively, from the circuit model of FIG. 4, As shown in Equation 35, when $N_{inj}$ is increased among the various design elements affecting $I_{out,\ amp}(S)$, $I_{out,\ amp}(s)$ is greatly increased in the operating frequency range of the AEF. The voltage gain of the injection transformer due to $N_{inj}$ may reduce the output voltage of the OP-AMP instead of increasing the output current thereof as described above. The injection transformer not only isolates the AEF ground from the SMPS ground, but also provides the gain and another design flexibility for the OP-AMP circuit.

Figure 9:
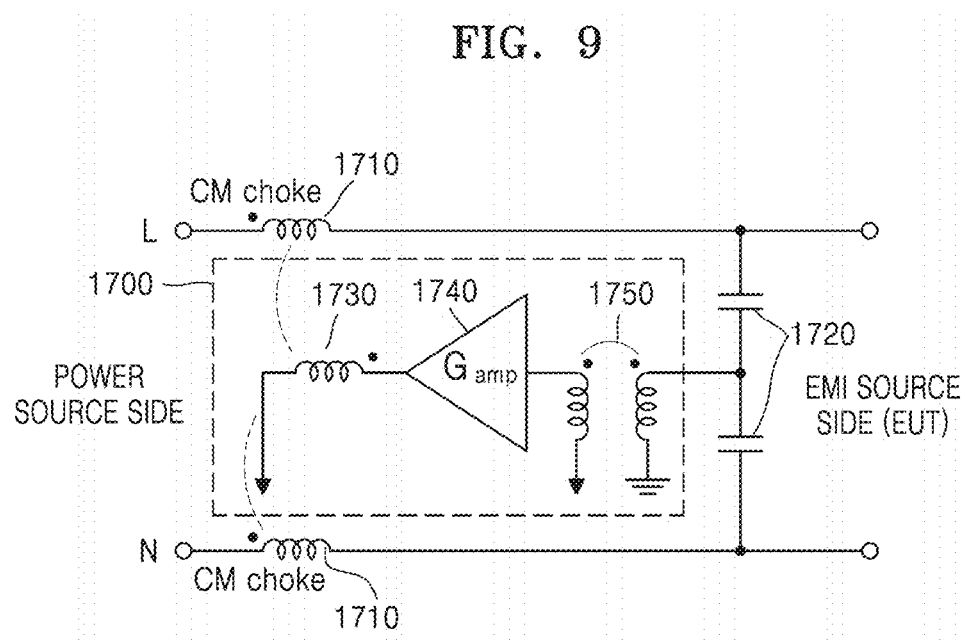
FIG. 9 is a circuit diagram illustrating a second embodiment of the isolated type active EMI filter having no additional elements on a power line according to the present disclosure.

Other embodiments of the isolated type active EMI filter having no additional elements on a power line according to the present disclosure will be described. FIG. 9 is a circuit diagram illustrating a second embodiment of the isolated type active EMI filter having no additional elements on a power line according to the present disclosure. The isolated type active EMI filter having no additional elements on a power line according the second embodiment of the present disclosure includes a CM choke 1710, a Y-cap 1720, a transformer 1750, an amplifier 1740, and a compensation winding 1730.

Referring to FIG. 9, the CM choke 1710 is disposed on a power source side from which power is supplied and has a form in which a live line and a neutral line, which are connected to an EMI source, are each wound with a winding.

The Y-cap 1720 is disposed on an EMI source side at which EMI occurs and includes two capacitors connected in series, and the two capacitors are connected in parallel between the live line and the neutral line and are commonly connected to the ground.

$$V_{out,amp}(s) = V_{in}(s) G_1(s) G_{amp}(s) \qquad \text{[Equation 34]}$$

$$I_{out,amp}(s) = \frac{V_{in}(s)}{2} \frac{\left( G_1(s)G_{amp}(s) + k_{inj}N_{inj}(sL_{inj1} \| R_{inj1}) \frac{1}{sC_{inj2}} \right) \frac{R_{\sigma 1} + R_{\sigma 2} + \frac{1}{sC_d} + R_{inj1} \| \frac{1}{sC_{inj2}}}{\left( R_d + \frac{1}{sC_d} \right) \left( R_{inj2} \| \frac{1}{sC_{inj2}} \right)} \left[ 1 - \frac{\frac{1}{sC_T} + 2 \left\{ \left( R_{d2} + \frac{1}{sC_d} \right) \| \left( R_{inj1} + R_{inj2} \| \frac{1}{sC_{inj1}} \right) \right\}}{Z_{line}} \right]}{\frac{1}{sC_c} + R_c + s_{inj1} \| R_{inj1} \| \frac{1}{sC_{inj1}}} \qquad \text{[Equation 35]}$$

where, $$V_{in}(s) = \frac{(Z_{line} + Z_{LISN}) \| Z_{Y,eff}}{2 Z_n + (Z_{line} + Z_{LISN}) \| Z_{Y,eff}} V_n(s). \qquad \text{[Equation 36]}$$

$V_{in}(s)$ is determined by $Z_n$ and $V_n(s)$ as well as the impedance of the filter including the AEF, so that information on a noise source model is necessary to estimate $V_{out,\ amp}(s)$ and $I_{out,\ amp}(S)$. The noise source model of the operating SMPS, $Z_n$, and $V_n$ may be extracted by a variety of previously developed measurement methods. Once $Z_n$ and $V_n(s)$ are extracted, time domain waveforms of an output voltage $v_{out,\ amp}(t)$ and an output current $i_{out,\ amp}(t)$ of the OP-AMP may be calculated from spectra of $V_{out,\ amp}(s)$ and $I_{out,\ amp}$ given in Equations 34 to 36. Thus, an output voltage capacity $V_{OPamp,\ max}$ and an output current capacity $i_{OPamp,\ max}$ of the OP-AMP should be sufficient to provide $v_{out,\ amp}(t)$ and $i_{out,\ amp}(t)$, respectively.

$$v_{OPamp,max} > \max(|v_{out,amp}(t)|) \qquad \text{[Equation 37]}$$

$$i_{OPamp,max} > \max(|2 i_{out,amp}(t)|). \qquad \text{[Equation 38]}$$

Since $I_{out,\ amp}(S)$ is defined in the half-circuit model, a value of the current actually flowing in the OP-AMP is twice the calculated current value as shown in Equation 38.

The transformer 1750 is installed in front of the Y-cap 1720, includes a primary coil that senses a noise voltage of the Y-CAP and a secondary coil through which the noise voltage is transformed, and is isolated from the power line.

The amplifier 1740 amplifies the noise voltage that is sensed and transformed by the transformer 1750.

The compensation winding 1730 is formed by winding a coil on the CM choke 1710, and injects the noise signal amplified by the amplifier into the CM choke 1710.

Figure 10:
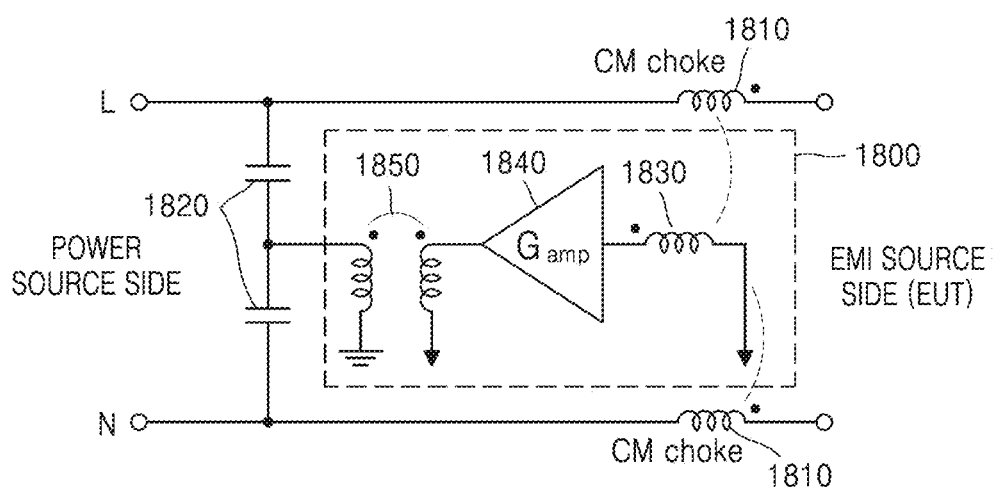
FIG. 10 is a circuit diagram illustrating a third embodiment of the isolated type active EMI filter having no additional elements on a power line according to the present disclosure.

FIG. 10 is a circuit diagram illustrating a third embodiment of the isolated type active EMI filter having no additional elements on a power line according to the present disclosure, which includes a CM choke 1810, a Y-cap 1820, a sensing winding 1830, an amplifier 1840, and a transformer 1850.

Referring to FIG. 10, the CM choke 1810 is disposed on an EMI source side at which EMI occurs and has a form in which a live line L and a neutral line N, which are connected to an EMI source, are each wound with a winding.

The Y-cap 1820 is disposed on a power source side from which power is supplied and includes two capacitors connected in series, and the two capacitors are connected in parallel between the live line L and the neutral line N and are commonly connected to the ground.

The sensing winding 1830 is formed by winding a coil on the CM choke 1810 and senses a noise current of the CM choke 1810.

The amplifier 1840 amplifies the noise current that is sensed through the sensing winding 1830.

The transformer 1850 is installed in front of the Y-CAP 1820, includes a primary coil that receives a signal amplified by the amplifier 1840 and a secondary coil that is isolated from the power line by being connected to the ground connected to the Y-cap 1820, and injects the signal transformed through the secondary coil into the Y-cap 1820 as a compensation signal.

Figure 11:
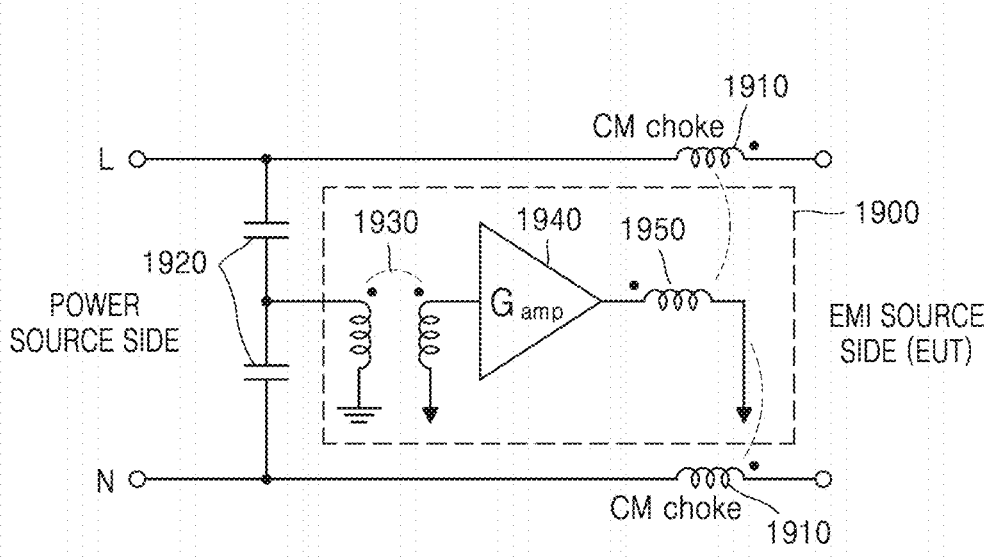
FIG. 11 is a circuit diagram illustrating a fourth embodiment of the isolated type active EMI filter having no additional elements on a power line according to the present disclosure.

FIG. 11 is a circuit diagram illustrating a fourth embodiment of the isolated type active EMI filter having no additional elements on a power line according to the present disclosure, which includes a CM choke 1910, a transformer 1930, an amplifier 1940, a Y-cap 1920, and a compensation winding 1950.

Referring to FIG. 11, the CM choke 1910 is disposed on a EMI source side at which EMI occurs and has a form in which a live line L and a neutral line N, which are connected to an EMI source, are each wound with a winding.

The Y-cap 1920 is disposed on a power source side from which power is supplied and includes two capacitors connected in series, and the two capacitors are connected in parallel between the live line and the neutral line and are commonly connected to the ground.

The transformer 1930 is installed in front of the Y-cap 1920, includes a primary coil that senses a noise voltage of the Y-CAP 1920 and a secondary coil through which the noise voltage is transformed, and is isolated from the power line.

The amplifier 1940 amplifies the noise voltage transformed by the transformer 1930.

The compensation winding 1950 is formed by winding a coil on the CM choke 1910, and injects the noise signal amplified by the amplifier 1940 into the CM choke 1910 as a compensation signal.

Figure 12:
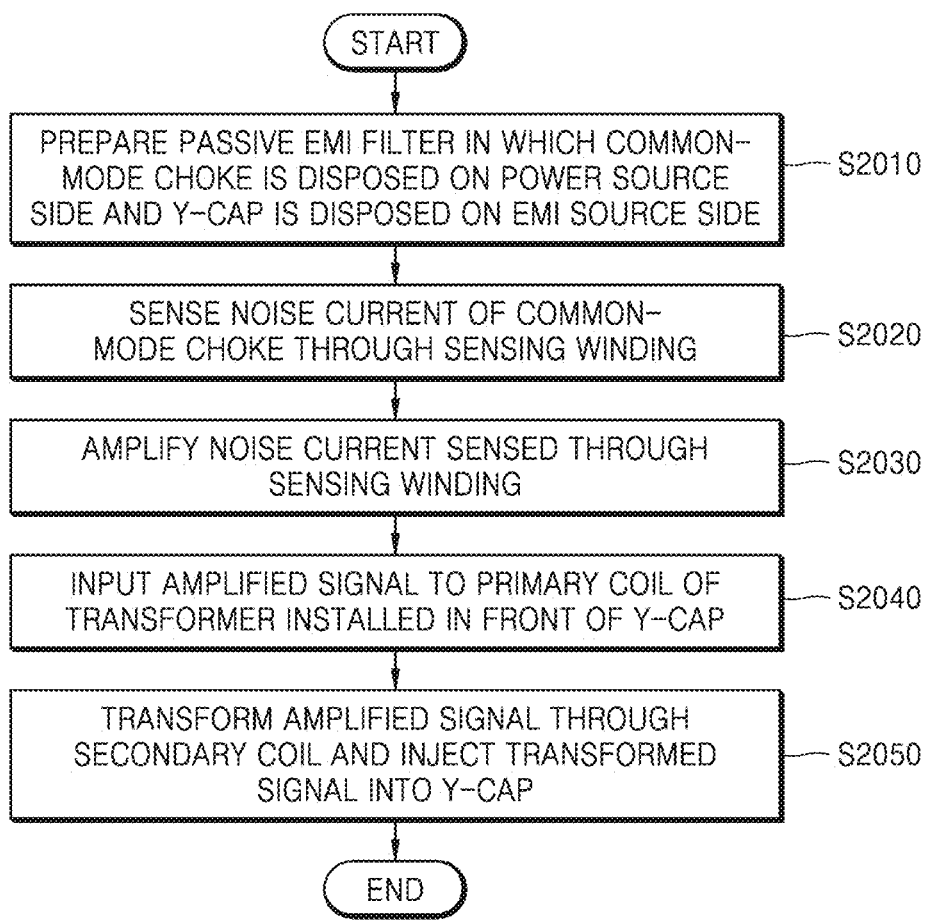
FIG. 12 is a flowchart illustrating a method of reducing EMI noise by adding active elements to a passive EMI filter, wherein the method corresponds to the first embodiment of the isolated type active EMI filter having no additional elements on a power line according to the present disclosure.

FIG. 12 is a flowchart illustrating a method of reducing EMI noise by adding active elements to a passive EMI filter, wherein the method corresponds to the first embodiment of the isolated type active EMI filter having no additional elements on a power line according to the present disclosure.

First, referring to FIGS. 1 and 12, a passive EMI filter in which a CM choke 1100 is disposed on a power source side and a Y-cap 1200 is disposed on an EMI source side is provided (S2010). That is, the CM choke 1100 is disposed on the power source side from which power is supplied and has a form in which a live line and a neutral line, which are connected to an EMI source, are each wound with a winding. The Y-cap 1200 is disposed on the EMI source side at which EMI occurs and includes two capacitors connected in series, and the two capacitors are connected in parallel between the live line L and the neutral line N and are commonly connected to the ground.

An EMI noise current of the CM choke 1100 is sensed through a sensing winding 1300 formed by winding a coil on the CM choke 1100 (S2020). The EMI noise current sensed through the sensing winding 1300 is amplified by an amplifier 1400 (S2030).

The signal, which is amplified by the amplifier 1400, is received through a primary coil of a transformer 1500 installed in front of the Y-cap 1200 (S2040). Then, the received signal is transformed through a secondary coil of the transformer 1500, and the transformed signal is injected into the Y-cap 1200 (S2050). Here, the secondary coil of the transformer 1500 is connected to the ground, which is connected to the Y-CAP 1200, and is isolated from the power line.

Figure 13:
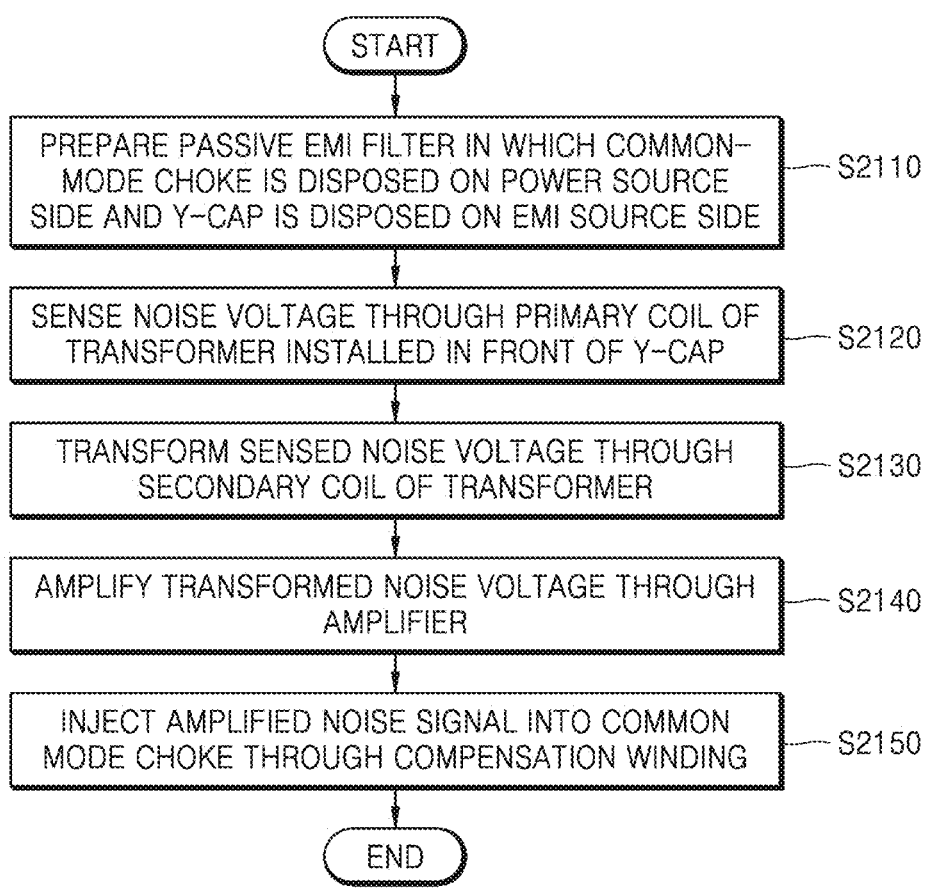
FIG. 13 is a flowchart illustrating a method of reducing EMI noise by adding active elements to a passive EMI filter, wherein the method corresponds to the second embodiment of the isolated type active EMI filter having no additional elements on a power line according to the present disclosure.

FIG. 13 is a flowchart illustrating a method of reducing EMI noise by adding active elements to a passive EMI filter, wherein the method corresponds to the second embodiment of the isolated type active EMI filter having no additional elements on a power line according to the present disclosure.

First, referring to FIGS. 9 and 13, a passive EMI filter in which a CM choke 1710 is disposed on a power source side and a Y-cap 1720 is disposed on an EMI source side is provided (S2110). More specifically, the CM choke 1710 is disposed on the power source side from which power is supplied and has a form in which a live line L and a neutral line N, which are connected to an EMI source, are each wound with a winding. The Y-cap 1720 is disposed on an EMI source side at which EMI occurs and includes two capacitors connected in series, and the two capacitors are connected in parallel between the live line L and the neutral line N and are commonly connected to the ground.

A noise voltage is sensed by a primary coil of a transformer 1730 installed in front of the Y-cap 1720 using the Y-cap 1720 as a sensing capacitor (S2120). The sensed noise voltage is transformed through a secondary coil of the transformer 1730 (S2130).Here, the secondary coil of the transformer 1730 is connected to the ground, which is connected to the Y-CAP 1720, and is isolated from the power line.

The transformed voltage of the secondary coil of the transformer 1730 amplified by an amplifier 1740 (S2140). The amplified signal is injected into the CM choke through a compensation winding 1750 that is formed by winding a coil on the CM choke (S2150).

Figure 14:
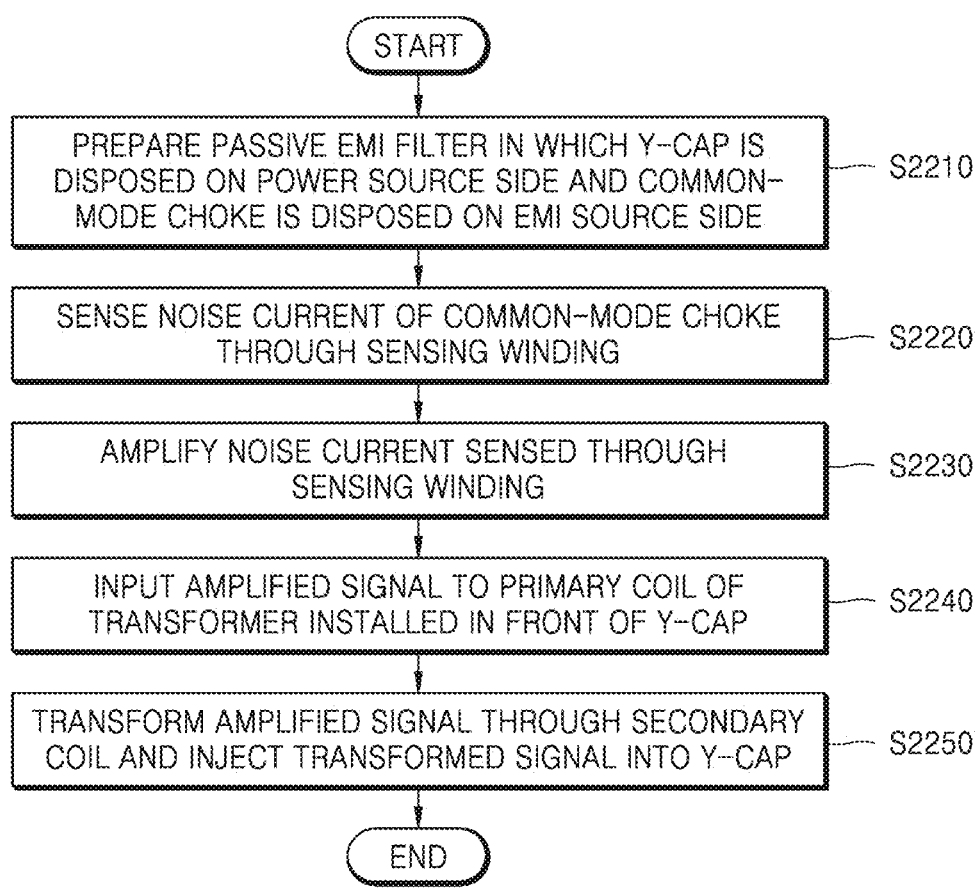
FIG. 14 is a flowchart illustrating a method of reducing EMI noise by adding active elements to a passive EMI filter, wherein the method corresponds to the third embodiment of the isolated type active EMI filter having no additional elements on a power line according to the present disclosure.

FIG. 14 is a flowchart illustrating a method of reducing EMI noise by adding active elements to a passive EMI filter, wherein the method corresponds to the third embodiment of the isolated type active EMI filter having no additional elements on a power line according to the present disclosure.

First, referring to FIGS. 10 and 14, a passive EMI filter in which a CM choke 1810 is disposed on an EMI source side and a Y-cap 1820 is disposed on a power source side is provided (S2210). More specifically, the CM choke 1810 is disposed on the EMI source side at which EMI occurs and has a form in which a live line L and a neutral line N, which are connected to an EMI source, are each wound with a winding. The Y-cap 1820 is disposed on the power source side from which power is supplied and includes two capacitors connected in series, and the two capacitors are connected in parallel between the live line L and the neutral line N and are commonly connected to the ground.

A noise current of the CM choke 1810 is sensed through a sensing winding 1830 formed by winding a coil on the CM choke 1810 (S2220). The noise current sensed through the sensing winding 1830 is amplified by an amplifier 1840 (S2230).

The signal, which is amplified by the amplifier 1840, is input to a primary coil of a transformer 1850 installed in front of the Y-cap 1820 (S2240). Afterward, the signal, which is input to the primary coil, is transformed through a secondary coil of the transformer 1850, and the transformed signal is injected into the Y-cap 1820 as a compensation signal (52250).Here, the secondary coil of the transformer 1850 is connected to the ground, which is connected to the Y-CAP 1820, and is isolated from the power line.

Figure 15:
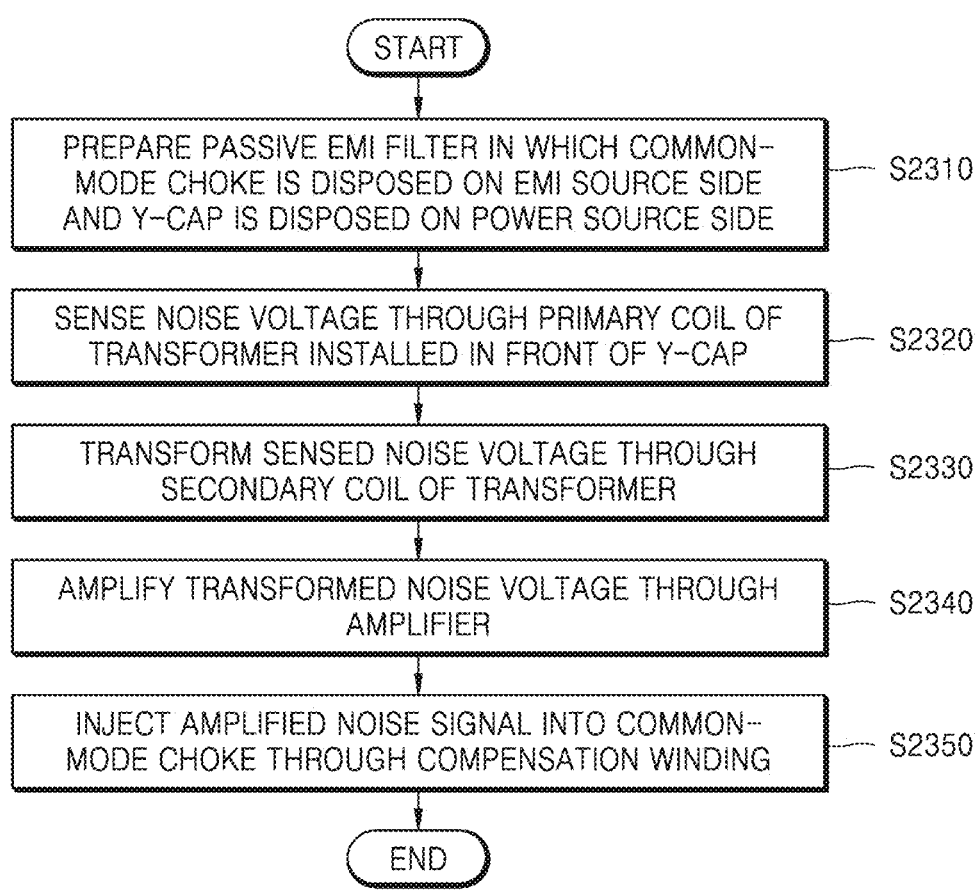
FIG. 15 is a flowchart illustrating a method of reducing EMI noise by adding active elements to a passive EMI filter, wherein the method corresponds to the fourth embodiment of the isolated type active EMI filter having no additional elements on a power line according to the present disclosure.

FIG. 15 is a flowchart illustrating a method of reducing EMI noise by adding active elements to a passive EMI filter, wherein the method corresponds to the fourth embodiment of the isolated type active EMI filter having no additional elements on a power line according to the present disclosure. First, referring to FIGS. 11 and 15, a passive EMI filter in which a CM choke 1910 is disposed on an EMI source side and a Y-cap 1920 is disposed on a power source side is provided (S2310). More specifically, the CM choke 1910 is disposed on the EMI source side at which EMI occurs and has a form in which a live line L and a neutral line N, which are connected to an EMI source, are each wound with a winding. The Y-cap 1920 is disposed on a power source side from which power is supplied and includes two capacitors connected in series, and the two capacitors are connected in parallel between the live line L and the neutral line N and are commonly connected to the ground.

A noise voltage of the Y-cap 1920 is sensed by a primary coil of a transformer 1930 installed in front of the Y-cap 1920 (S2320). The noise voltage, which is sensed by the primary coil, is transformed through a secondary coil of the transformer 1930 (S2330), and here, the secondary coil of the transformer 1930 is connected to the ground, which is connected to the Y-cap 1920, and is isolated from the power line.

The noise voltage transformed through the secondary coil is amplified by an amplifier 1940 (S2340), and the amplified noise signal is injected into the CM choke 1910 as a compensation signal through a compensation winding 1950 that is formed by winding a coil on the CM choke 1910, (S2350).

In the above, the isolated type active EMI filter having no additional elements on a power line according to the present disclosure is an active filter of a type being additionally installed in an existing passive EMI filter consisting of a common-mode choke and a Y-cap. The present disclosure proposes a choke element that is added to a power line by winding a noise sensing or compensation wire on the common-mode choke existing in the passive EMI filter. The Y-cap present in the passive EMI filter is used as a compensation or sensing capacitor, and a small transformer is installed in front of the compensation or sensing capacitor, so that the active circuit is isolated from the power line, and consequently, there is an advantage in that the active circuit is isolated from the power line without elements added to the power line.

In the isolated type active EMI filter according to the present disclosure, the sensing or compensation wire is wound with the optimum number of turns so as not to degrade the noise reduction performance of the passive EMI filter itself. The turn ratio of the transformer is adjusted and the gain of the active filter amplifier is optimized to optimize noise sensing and compensation performance through the Y-cap and the small transformer in front of the Y-cap. Various stability compensation circuits may be added to secure feedback stability in the entire feedback circuit structure for noise sensing and compensation. The active type EMI filter of the present disclosure has a feedback circuit structure in which noise is sensed and a compensation signal is injected.

According to the embodiment of the present disclosure, conductive noise in a low-frequency band is attenuated by 11 dB when only the passive filter is used, but is attenuated by 26 dB when the AEF of the present disclosure is additionally mounted. When only the passive filter is used, an expensive common-mode choke should be used or the total number of stages of the filter should be increased to sufficiently attenuate the noise in the low-frequency band.

Figure 16:
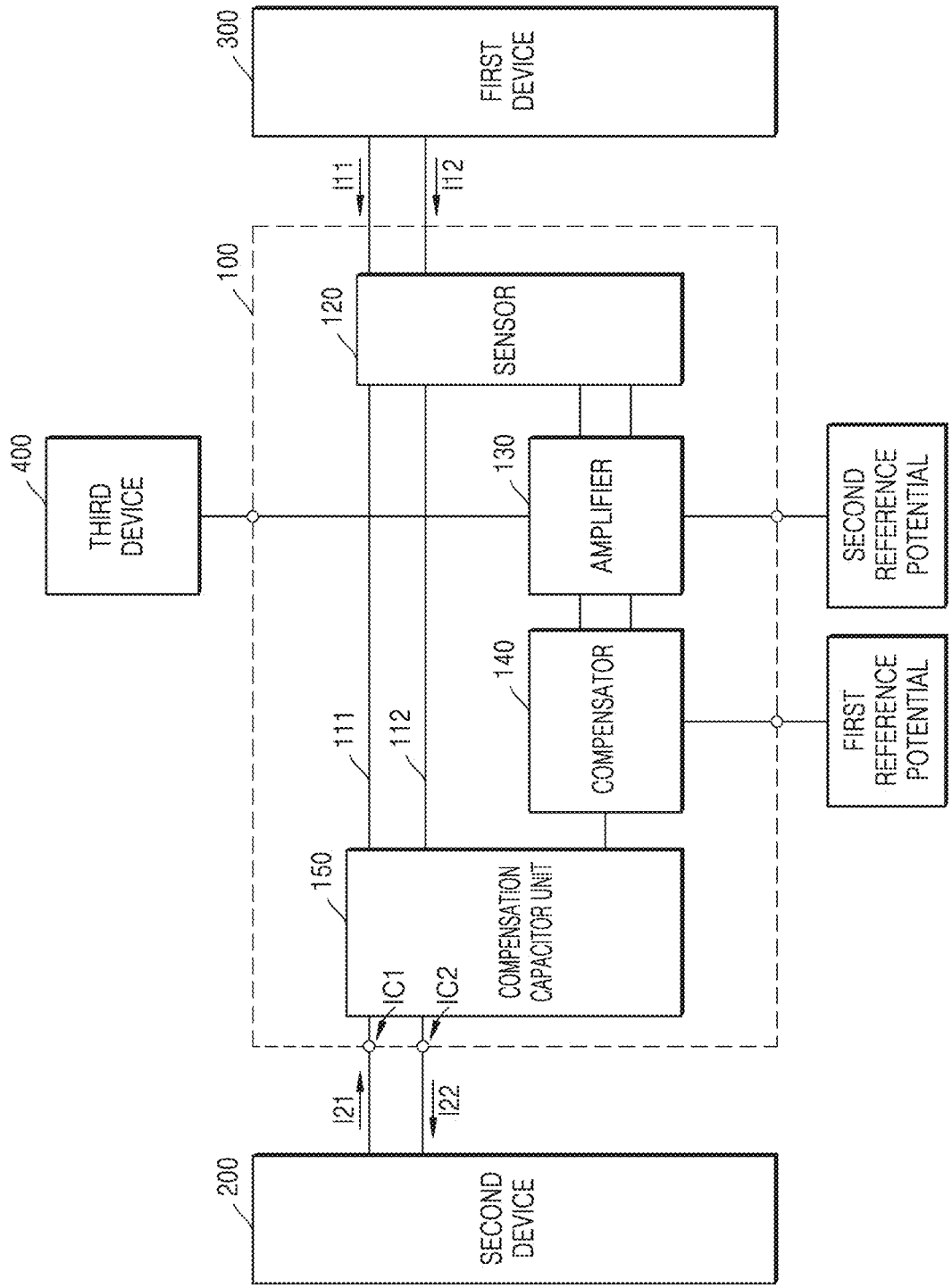
FIG. 16 is a diagram schematically illustrating a configuration of a system including a current compensation device (100) according to one embodiment of the present disclosure.

FIG. 16 is a diagram schematically illustrating a configuration of a system including a current compensation device 100 according to one embodiment of the present disclosure.

The current compensation device 100 according to one embodiment of the present disclosure may actively compensates for first currents I11 and I12 that are input as a common-mode current with respect to at least two or more high-current paths 111 and 112 connected to a first device 300. To this end, the current compensation device 100 according to one embodiment of the present disclosure may include at least two or more high-current paths 111 and 112, a sensor 120, an amplifier 130, a compensator 140, and a compensation capacitor unit 150.

The two or more high-current paths 111 and 112 may be paths in the current compensation device 100 for transmitting second currents I21 and I22 supplied from a second device 200 to the first device 300, for example, may be power lines. According to one embodiment, the two or more high-current paths 111 and 112 may be a live line and a neutral line.

As used herein, the second device 200 may be any of various types of devices for supplying power to the first device 300 in the form of current and/or voltage. For example, the second device 200 may be a device that produces and supplies power, or may also be a device (e.g., an electric vehicle charging apparatus) that supplies power generated by another device. Of course, the second device 200 may also be a device for supplying stored energy. However, this is merely exemplary, and the scope of the present disclosure is not limited thereto.

In the present specification, the first device 300 may be any of various types of devices using the power supplied by the second device 200. For example, the first device 300 may be a load that is driven using the power supplied by the second device 200. In addition, the first device 300 may be a load (e.g., an electric vehicle) that stores energy using the power supplied by the second device 200 and is driven using the stored energy. However, this is merely exemplary, and the scope of the present disclosure is not limited thereto.

As described above, each of the two or more high-current paths 111 and 112 may be a path for transmitting the power supplied by the second device 200, that is, the second currents I21 and I22 to the first device 300, and according to one embodiment, the second currents I21 and I22 may be an alternating current having a frequency of a second frequency band. At this point, the second frequency band may be, for example, a band having a range of 50 Hz to 60 Hz.

Further, each of the two or more high-current paths 111 and 112 may also be a path through which at least a portion of noise generated by the first device 300, that is, the first currents I11 and I12, is transmitted to the second device 200. In this case, the first currents I11 and I12 may be input as a common-mode current with respect to each of the two or more high-current paths 111 and 112.

The first currents I11 and I12 may be currents that are not intentionally generated in the first device 300 due to various causes. For example, the first currents I11 and I12 may be noise currents generated by virtual capacitances between the first device 300 and the surrounding environment.

The first currents I11 and I12 may be currents having a frequency of a first frequency band. In this case, the first frequency band may be a frequency band higher than the above-described second frequency band, for example, may be a band having a range of 150 KHz to 30 MHz.

Figure 21:
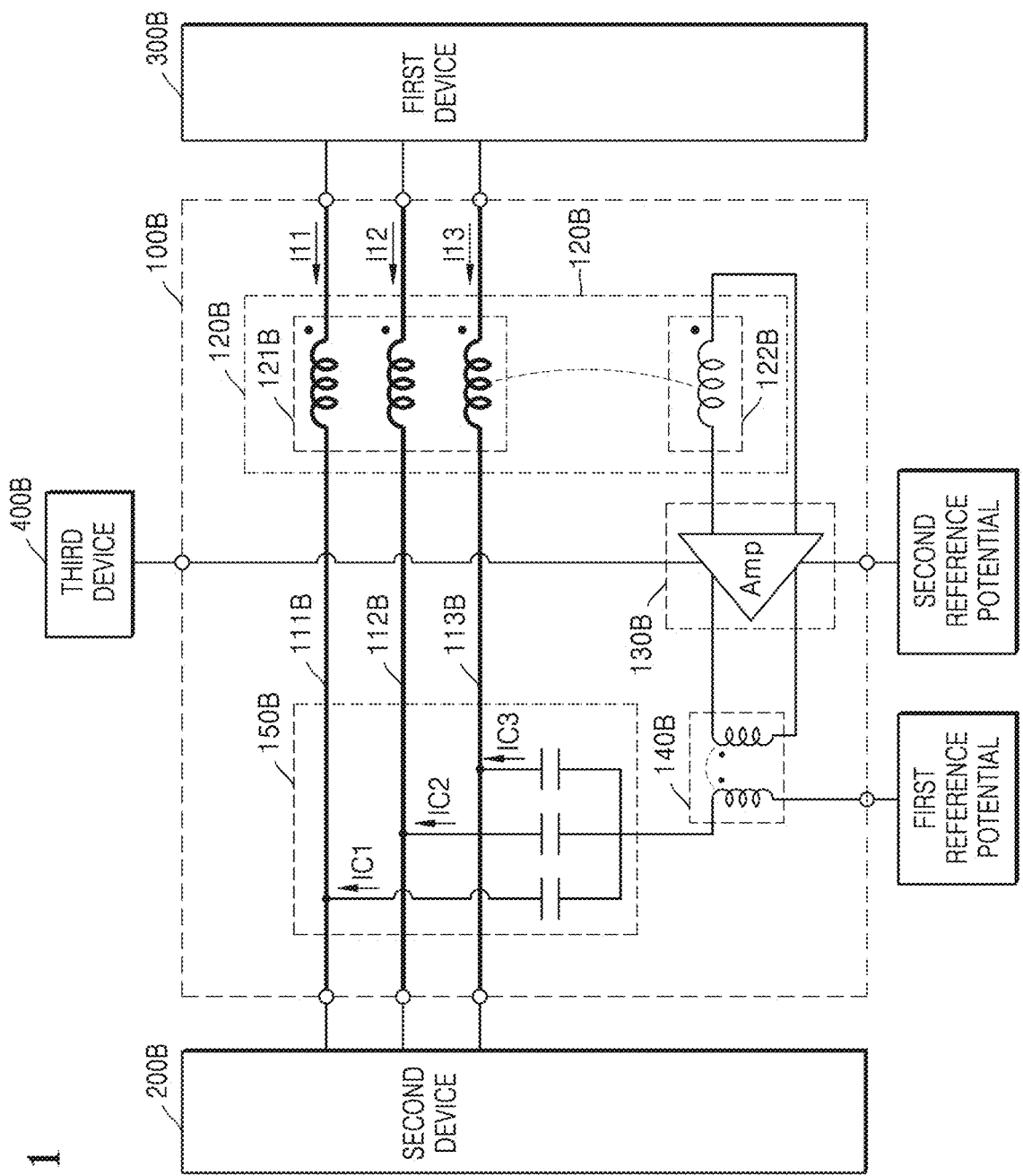
FIG. 21 is a diagram schematically illustrating a configuration of a current compensation device (100B) according to another embodiment of the present disclosure.
Figure 22:
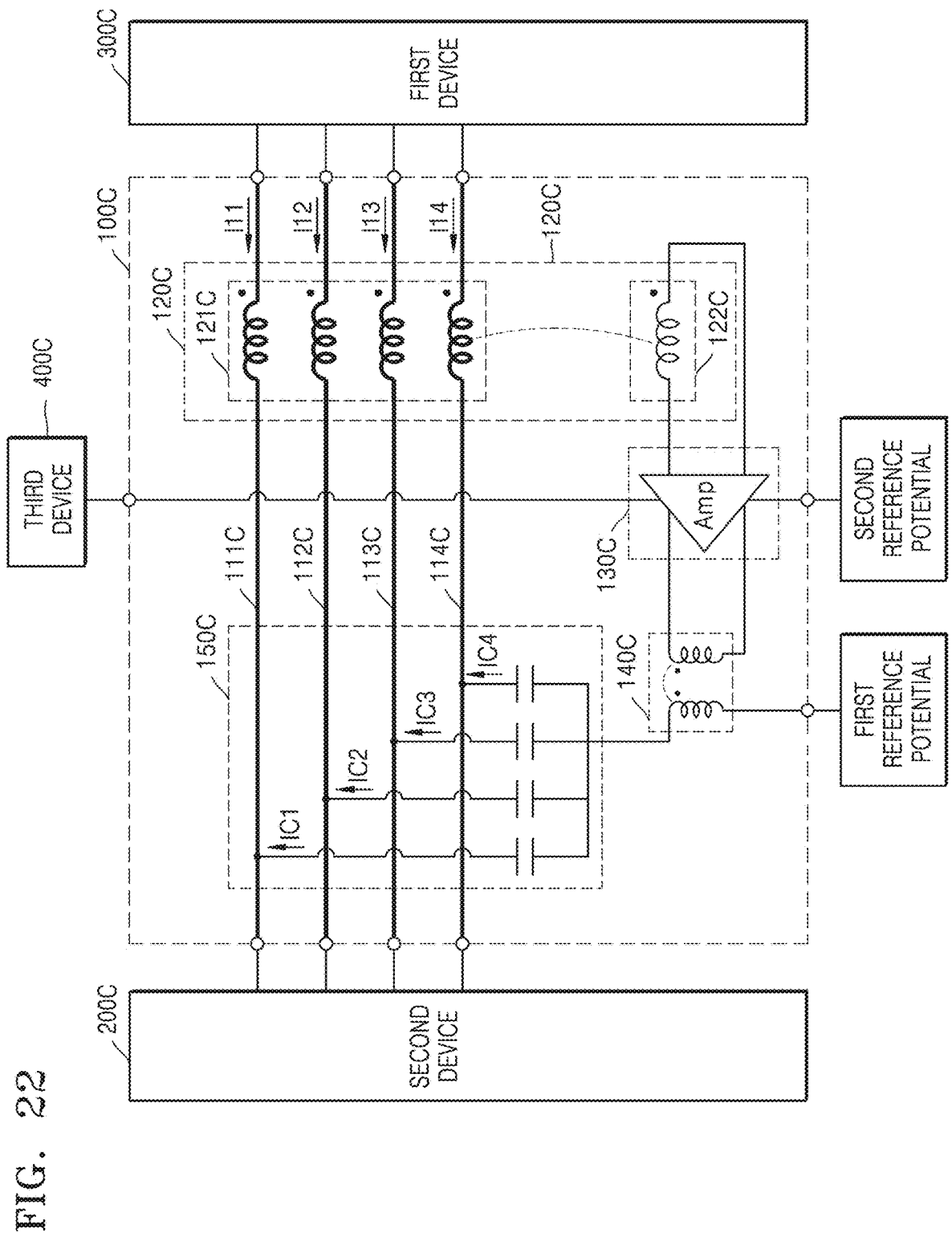
FIG. 22 is a diagram schematically illustrating a configuration of a current compensation device (100C) according to still another embodiment of the present disclosure.

Meanwhile, the two or more high-current paths 111 and 112 may include two paths as shown in FIG. 16, and may include three paths or four paths as shown in FIGS. 21 and 22. The number of the high-current paths 111 and 112 may vary depending on the form and/or type of power used by the first device 300 and/or the second device 200.

Meanwhile, the sensor 120 is electrically connected to high-current paths 111 and 112, senses the first currents I11 and I12 on the two or more high-current paths 111 and 112, and generates output signals corresponding to the first currents I11 and I12. In other words, the sensor 120 may mean a component for sensing the first currents I11 and I12 on the high-current paths 111 and 112.

According to one embodiment, the sensor 120 may be implemented as a sensing transformer. In this case, the sensing transformer may be a component for sensing the first currents I11 and I12 on the high-current paths 111 and 112 in a state of being isolated from the high-current paths 111 and 112.

According to one embodiment, the sensor 120 may be differentially connected to input terminals of the amplifier 130, which will be described below.

The amplifier 130 may be electrically connected to the sensor 120, and may amplify an output signal output from the sensor 120 to generate an amplified output signal.

The term "amplification" by the amplifier 130, as used herein, may mean that the magnitude and/or phase of an object to be amplified is adjusted.

By the amplifying operation of the amplifier 130, the current compensation device 100 may generate compensation currents IC1 and IC2 having the same magnitude and an opposite phase compared to the first currents I11 and I12, thereby compensating for the first currents I11 and I12 on the high-current paths 111 and 112.

The amplifier 130 may be implemented by various components. In one embodiment, the amplifier 130 may include an OP-AMP. In another embodiment, the amplifier 130 may include a plurality of passive elements, such as resistors and capacitors, in addition to the OP-AMP. In still another embodiment, the amplifier 130 may include bipolar junction transistors (BJTs). In yet another embodiment, the amplifier 130 may include a plurality of passive elements, such as resistors and capacitors, in addition to the BJTs. However, the above-described implementation method of the amplifier 130 is merely exemplary, and the scope of the present disclosure is not limited thereto, and the component for the "amplification" described in the present disclosure may be used without being limited to the amplifier 130 of the present disclosure.

The amplifier 130 may receive power from a third device 400, which is distinct from the first device 300 and/or the second device 200, and amplify the output signal output from the sensor to generate an amplified current. Here, the third device 400 may be a device that receives power from a power source independent of the first device 300 and the second device 200 and generates input power of the amplifier 130. Alternatively, the third device 400 may be a device that receives power from one of the first device 300 and the second device 200 and generates the input power of the amplifier 130.

The compensator 140 may be electrically connected to the amplifier 130 and generate a compensation current on the basis of the output signal amplified by the amplifier 130.

The compensator 140 may be electrically connected to a path connecting an output terminal of the amplifier 130 and a second reference potential of the amplifier 130 to generate the compensation current. The compensator 140 may be electrically connected to a path connecting the compensation capacitor unit 150 and a first reference potential of the current compensation device 100. The second reference potential of the amplifier 130 and the first reference potential of the current compensation device 100 may be different potentials.

The compensation capacitor unit 150 may provide a path through which the compensation current generated by the compensator 140 flows to each of the two or more high-current paths.

According to one embodiment, the compensation capacitor unit 150 may be implemented as a compensation capacitor unit that provides a path through which the current generated by the compensator 140 flows to each of the two or more high-current paths 111 and 112. In this case, the compensation capacitor unit 150 may include at least two or more compensation capacitors connecting the first reference potential of the current compensation device 100 and the two or more high-current paths 111 and 112, respectively.

The current compensation device 100 configured as described above may sense a current at a specific condition on the two or more high-current paths 111 and 112 and actively compensate for the current, and thus may be applied to a high-current, high-voltage, and/or high-power system even when the current compensation device 100 is miniaturized.

Hereinafter, the current compensation device 100 according to various embodiments will be described with reference to FIGS. 17 to 22 together with FIG. 16.

Figure 17:
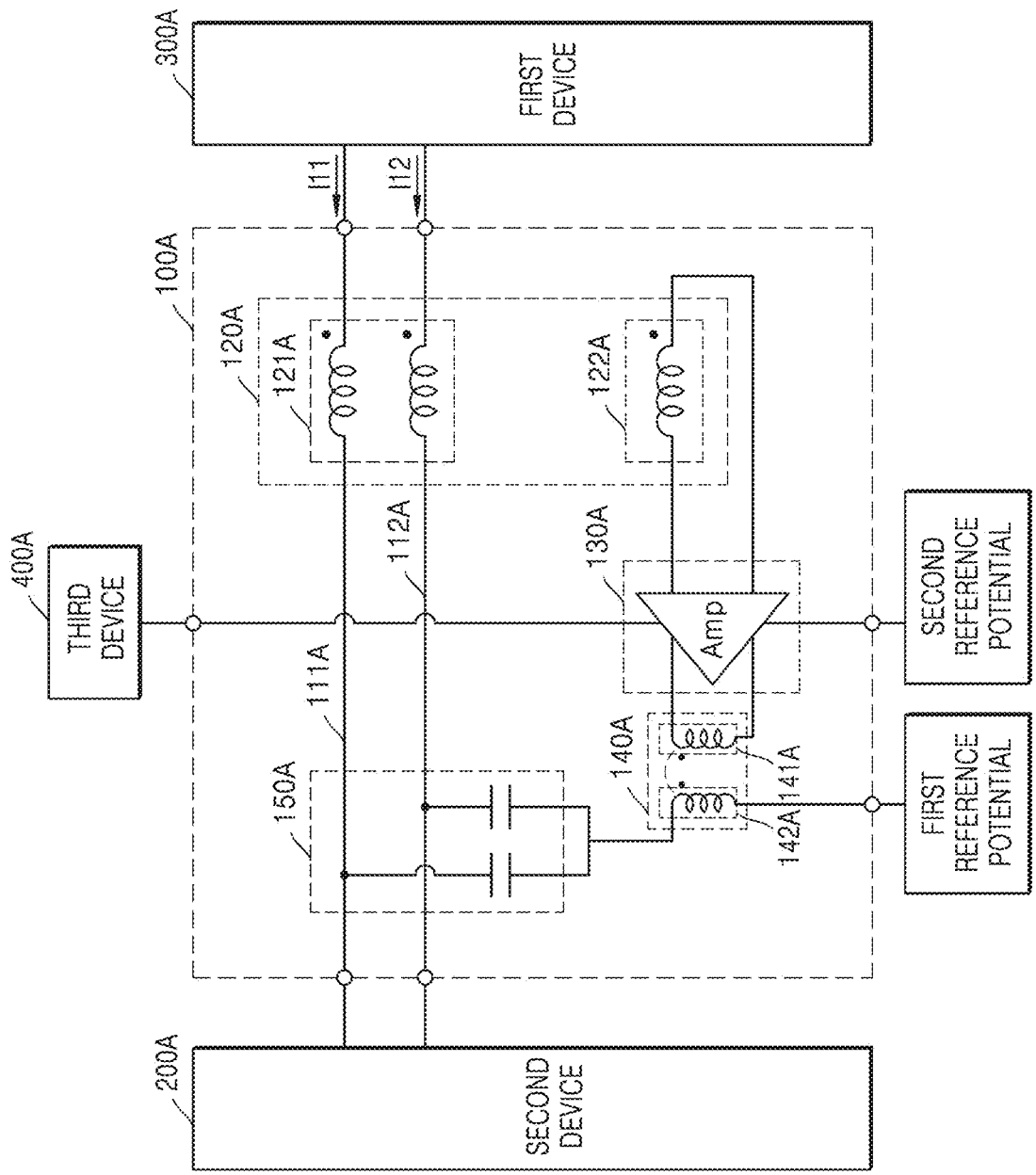
FIG. 17 is a diagram schematically illustrating a configuration of a current compensation device (100A) used in a two-line system according to one embodiment of the present disclosure.

FIG. 17 is a diagram schematically illustrating a configuration of a current compensation device 100A used in a two-line system according to one embodiment of the present disclosure.

The current compensation device 100A according to one embodiment of the present disclosure may actively compensates for first currents I11 and I12 that are input as a common-mode current with respect to each of two high-current paths 111A and 112A connected to a first device 300A.

To this end, the current compensation device 100A according to one embodiment of the present disclosure may include two high-current paths 111A and 112A, a sensing transformer 120A, an amplifier 130A, a compensation transformer 140A, and a compensation capacitor unit 150A.

In one embodiment, the sensor 120 may include the sensing transformer 120A. In this case, the sensing transformer 120A may be a component for sensing the first currents I11 and I12 on the high-current paths 111A and 112A in a state of being isolated from the high-current paths 111A and 112A.

In the sensing transformer 120A, a primary side 121A disposed on the high-current paths 111A and 112A may generate a first induced current, which is directed toward a secondary side 122A, on the basis of a first magnetic flux density induced by the first currents I11 and I12. Here, the secondary side 122A of the sensing transformer 120A may be differentially connected to input terminals of the amplifier 130, which will be described below.

Figure 18:
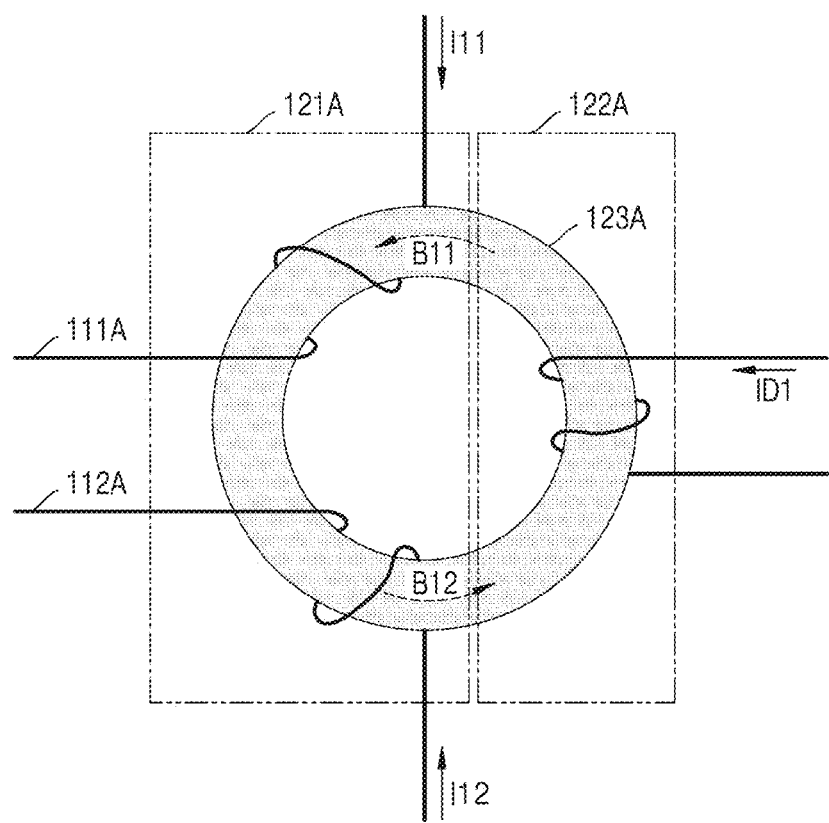
FIG. 18 a view for describing the principle in which a sensing transformer (120A) generates a first induced current (ID1).

FIG. 18 a view for describing the principle in which the sensing transformer 120A generates a first induced current ID1.

For convenience of description, the description is made on the premise that the primary side 121A and the secondary side 122A of the sensing transformer 120A are configured as shown in FIG. 18. In other words, the description is made on the premise that the high-current paths 111A and 112A and windings of the secondary side 122A are wound around a core 123A of the sensing transformer 120A in consideration of directions in which magnetic flux and/or magnetic flux densities are generated.

As the first current I11 is input to the high-current path 111A, a magnetic flux density B11 may be induced in the core 123A. Similarly, as the first current I12 is input to the high-current path 112A, a magnetic flux density B12 may be induced in the core 123A.

The induced magnetic flux densities B11 and B12 may cause the first induced current ID1 to be induced in the windings of the secondary side 122A.

As described above, the sensing transformer 120A may be configured such that the first magnetic flux densities B11 and B12 induced due to the first currents I11 and I12 may be overlapped with each other (or may be reinforced with each other), and thus may generate the first induced current ID1 corresponding to the first currents I11 and I12 at the secondary side 122A isolated from the two or more high-current paths 111A and 112A.

Meanwhile, the number of turns by which the high-current paths 111A and 112A and the winding of the secondary side 122A are wound around the core 123A may be appropriately determined according to the requirements of the system in which the current compensation device 100A is used. For example, both the high-current paths 111A and 112A and the windings of the secondary side 122A may be wound only once around the core 123A. In this case, the sensing transformer 120A may be configured in a form in which the high-current paths 111A and 112A and the windings of the secondary side 122a pass through only a central hole of the core 123A. However, this is merely exemplary, and the scope of the present disclosure is not limited thereto.

Meanwhile, the sensing transformer 120A may be configured such that second magnetic flux densities, which are induced due to the second currents I21 and I22 respectively flowing through the two or more high-current paths 111A and 112A, satisfy a predetermined magnetic flux density condition.

Figure 19:
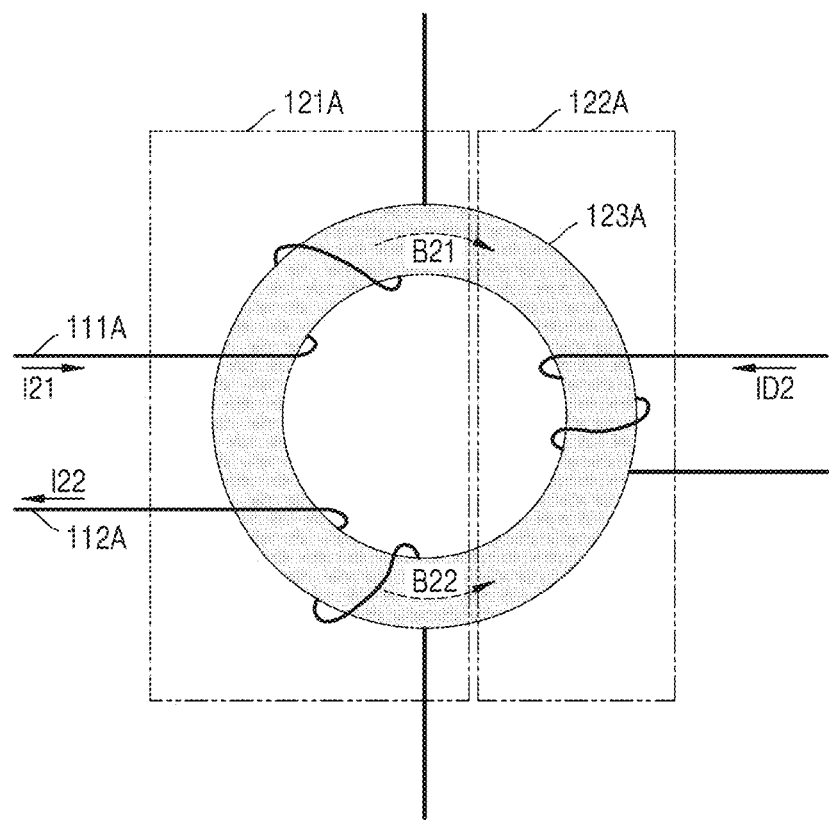
FIG. 19 is a view for describing second magnetic flux densities (B21 and B22) that are induced in the sensing transformer (120A) due to second currents (I21 and I22).

FIG. 19 is a view for describing second magnetic flux densities B21 and B22 that are induced in the sensing transformer 120A due to the second currents I21 and I22.

Similar to FIG. 18, the description is made on the premise that the primary side 121A and the secondary side 122A of the sensing transformer 120A are configured as shown in FIG. 19. In other words, the description is made on the premise that the two or more high-current paths 111A and 112A and the windings of the secondary side 122A are wound around the core 123A of the sensing transformer 120A in consideration of directions in which magnetic flux and/or magnetic flux densities are generated.

As the second current I21 is input to the high-current path 111A, the magnetic flux density B21 may be induced in the core 123A. Similarly, as the second current I22 is input (or output) to the high-current path 112A, the magnetic flux density B22 may be induced in the core 123A.

The sensing transformer 120A may be configured such that the second magnetic flux densities B21 and B22 induced due to the second currents I21 and I22 (respectively flowing through the two or more high-current paths 111A and 112A) satisfy a predetermined magnetic flux density condition. In this case, the predetermined magnetic flux density condition may be a condition in which densities cancel each other, as shown in FIG. 19.

In other words, the sensing transformer 120A may be configured such that a second induced current ID2, which is induced due to the second currents I21 and I22 respectively flowing the two or more high-current paths 111A and 112A, satisfies a predetermined condition for a second induced current. In this case, the predetermined condition for a second induced current may be a condition that a magnitude of the second induced current ID2 is less than a predetermined threshold magnitude.

As described above, the sensing transformer 120A is configured such that the second magnetic flux densities B21 and B22 induced due to the second currents I21 and I22 may cancel each other, so that only the first currents I11 and I12 are sensed.

The sensing transformer 120A may be configured such that magnitudes of the first magnetic flux densities B11 and B12, which are induced due to the first currents I11 and I12 of a first frequency band (for example, the band in a range of 150 KHz to 30 MHz), are greater than magnitudes of the second magnetic flux densities B21 and B22 induced due to the second currents I21 and I22 of a second frequency band (for example, the band in a range of 50 Hz to 60 Hz).

In the present disclosure, when a component "A" is referred to as being configured to do "B," it may mean that design parameters of the component "A" are set to be appropriate for doing "B." For example, a case in which the sensing transformer 120A is configured such that a magnitude of a magnetic flux induced due to a current in a specific frequency band is great may mean that parameters are appropriately set so that the magnitude of the magnetic flux induced due to the current in the specific frequency band is great, wherein the parameters may include a size of the sensing transformer 120A, a diameter of the core, the number of turns, a magnitude of inductance, and a magnitude of mutual-inductance, and the like.

As shown in FIG. 17, the secondary side 122A of the sensing transformer 120A may be differentially connected to the input terminals of the amplifier 130A in order to supply the first induced currents to the amplifier 130A. In addition, depending on the configuration of the amplifier 130A, the secondary side 122A of the sensing transformer 120A may be disposed on the path connecting the input terminal of the amplifier 130A and the second reference potential of the amplifier 130A.

Meanwhile, as described above, the sensor 120 is illustrated as being implemented as the sensing transformer 120A, but the scope of the present disclosure is not limited thereto. Thus, a component for sensing only the first currents I11 and I12, which are input as a common-mode current on the high-current paths 111A and 112A, may be used without limitation to the sensor 120.

The amplifier 130 may amplify the output signal output from the sensor 120 to generate the amplified output signal.

In one embodiment, the amplifier 130 may be implemented as the amplifier 130A that amplifies the first induced current generated by the sensing transformer 120A to generate the amplified current.

The term "amplification" by the amplifier 130, as used herein, may mean that the magnitude and/or phase of an object to be amplified is adjusted. For example, the amplifier 130A may change a phase of the first induced current by 180° and increase a magnitude of the first induced current by K times (where K>=1) to generate the amplified current.

By the amplifying operation of the amplifier 130A as described above, the current compensation device 100A may generate the compensation currents IC1 and IC2 having the same magnitude and an opposite phase compared to the first currents I11 and I12, thereby compensating for the first currents I11 and I12 on the high-current paths 111A and 112A.

The amplifier 130A may generate the amplified current in consideration of a voltage transformation ratio in the sensing transformer 120A and a voltage transformation ratio in the compensator 140, which will be described below.

For example, in a case in which the sensing transformer 120A transforms the first currents I11 and I12 having a magnitude of one to a first induced current having a magnitude of 1/F1, and the compensator 140 is implemented as the compensation transformer 140A that transforms an amplified current having a magnitude of one to a compensation current having a magnitude of 1/F2, the amplifier 130A may generate an amplified current having a magnitude that is F1×F2 times the magnitude of the first induced current. Here, the amplifier 130A may generate the amplified current such that the phase of the amplified current is opposite to the phase of the first induced current.

The amplifier 130A may be implemented by various components. For example, the amplifier 130A may include an OP-AMP. Alternatively, the amplifier 130A may include a plurality of passive elements, such as resistors and capacitors, in addition to the OP-AMP. Further, the amplifier 130A may include BJTs. Alternatively, the amplifier 130A may include a plurality of passive elements in addition to the BJTs. However, the above-described implementation method of the amplifier 130A is merely exemplary, and the scope of the present disclosure is not limited thereto, and the component for the "amplification" described in the present disclosure may be used without being limited to the amplifier 130A of the present disclosure.

As described above, the amplifier 130A may receive power from a third device 400A and amplify the first induced current to generate the amplified current.

The compensator 140 may generate the compensation current on the basis of the output signal amplified by the amplifier 130.

In one embodiment, the compensator 140 may include the compensation transformer 140A. In this case, the compensation transformer 140A may be a component for generating a compensation current, which is directed toward the high-current paths 111A and 112A (or a secondary side 142A to be described below), on the basis of the amplified current in a state of being isolated from the high-current paths 111A and 112A as described above.

In more detail, in the compensation transformer 140A, a primary side 141A differentially connected to output terminals of the amplifier 130A may generate the compensation current, which is directed toward the secondary side 142A, on the basis of a third magnetic flux density induced due to the amplified current generated by the amplifier 130A. In this case, the secondary side 142A may be disposed on a path connecting the compensation capacitor unit 150A to be described below and the first reference potential of the current compensation device.

Meanwhile, the primary side 141A of the compensation transformer 140A, the amplifier 130A, and the secondary side 122A of the sensing transformer 120A may be connected to the second reference potential that may be a reference potential different from those of the remaining components of the current compensation device 100A.

As described above, in the present disclosure, the components generating the compensation current may use a reference potential different from those of the remaining components and may also use a separate power, and thus may operate in an isolated state, thereby improving the reliability of the current compensation device 100A.

In one embodiment, the compensation capacitor unit 150 may be implemented as the compensation capacitor unit 150A that provides a path through which the current generated by the compensation transformer 140A flows to each of the two high-current paths 111A and 112A.

Figure 20:
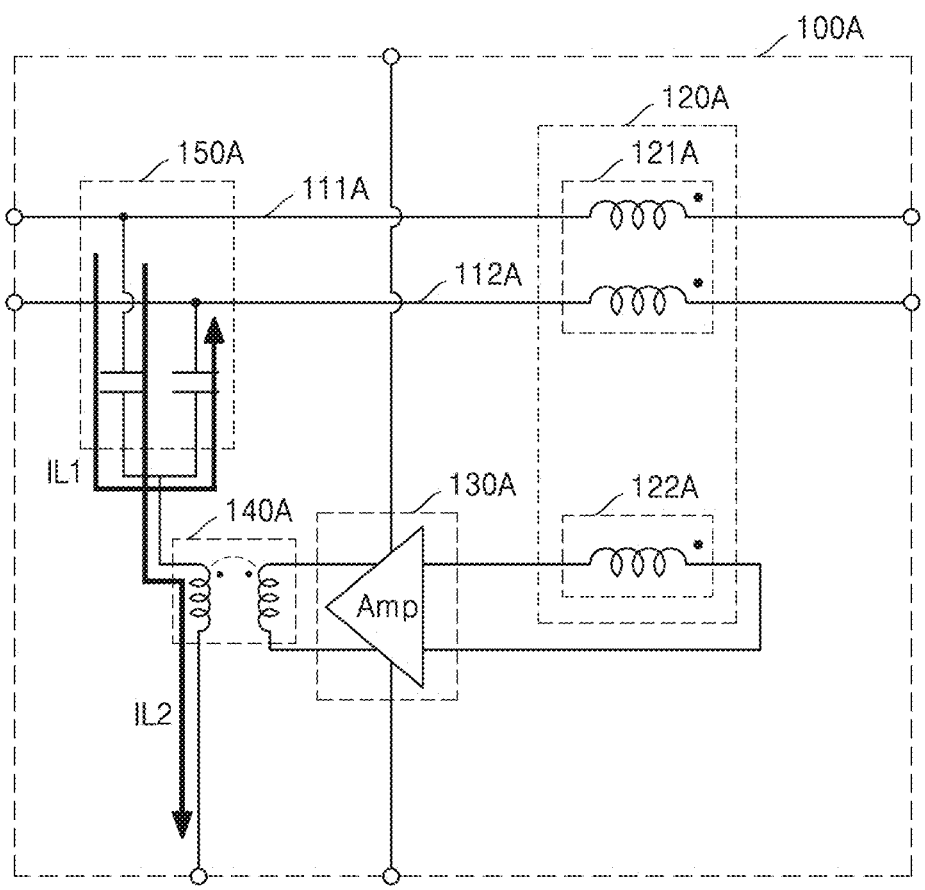
FIG. 20 is a diagram for describing currents (IL1 and IL2) flowing through a capacitor unit (150A).

FIG. 20 is a diagram for describing currents IL1 and IL2 flowing through the compensation capacitor unit 150A.

The compensation capacitor unit 150A may be configured such that the current IL1 flowing between the two high-current paths 111A and 112A through compensation capacitors satisfies a first predetermined current condition. In this case, the first predetermined current condition may be a condition in which a magnitude of the current IL1 is less than a first predetermined threshold magnitude.

Further, the compensation capacitor unit 150A may be configured such that the current IL2 flowing between the first reference potential of the current compensation device 100A and each of the two high-current paths 111A and 112A through the compensation capacitors satisfies a second current condition. In this case, the second predetermined current condition may be a condition in which a magnitude of the current IL2 is less than a second predetermined threshold magnitude.

The compensation current flowing to each of the two high-current paths 111A and 112A along the compensation capacitor unit 150A may cancel the first currents I11 and I12 on the high-current paths 111A and 112A, thereby preventing the first currents I11 and I12 from being transmitted to a second device 200A. Here, the first currents I11 and I12 and the compensation current may be currents having the same magnitude and opposite phases.

As a result, the current compensation device 100A according to one embodiment of the present disclosure may actively compensates for the first currents I11 and I12 that are input as a common-mode current with respect to each of two high-current paths 111A and 112A connected to the first device 300A, and thus may prevent the second device 200A from malfunctioning or being damaged.

FIG. 21 is a diagram schematically illustrating a configuration of a current compensation device 100B according to another embodiment of the present disclosure. Hereinafter, the description of contents overlapping the contents described with reference to FIGS. 16 to 20 will be omitted.

The current compensation device 100B according to another embodiment of the present disclosure may actively compensates for first currents I11, I12, and I13 that are input as a common-mode current with respect to each of high-current paths 111B, 112B, and 113B connected to a first device 300B.

To this end, the current compensation device 100B according to another embodiment of the present disclosure may include three high-current paths 111B, 112B, and 113B, a sensing transformer 120B, an amplifier 130B, a compensation transformer 140B, and a compensation capacitor unit 150B.

When it is described in comparison with the current compensation device 100A according to the embodiment described with reference to FIGS. 17 to 20, the current compensation device 100B according to the embodiment illustrated with reference to FIG. 21 includes three high-current paths 111B, 112B, and 113B, and thus has differences in the sensing transformer 120B and the compensation capacitor unit 150B. Thus, hereinafter, the current compensation device 100B will be described focusing on the above-described differences.

The current compensation device 100B according to another embodiment of the present disclosure may include a first high-current path 111B, a second high-current path 112B, and a third high-current path 113B, which are distinct from each other. According to one embodiment, the first high-current path 111B may be an R-phase power line, the second high-current path 112B may be an S-phase power line, and the third high-current path 113B may be a T-phase power line. The first currents I11, I12, and I13 may be input as a common-mode current with respect to each of the first high-current path 111B, the second high-current path 112B, and the third high-current path 113B.

A primary side 121B of the sensing transformer 120B according to another embodiment of the present disclosure may be disposed in each of the first high-current path 111B, the second high-current path 112B, and the third high-current path 113E to generate a first induced current. Magnetic flux densities generated by the sensing transformer 120B due to the first currents I11, I12, and I13 on the three high-current paths 111B, 112B, and 113B may be reinforced with each other. The process in which the first induced current is generated due to the first currents I11, I12, and I13 is described with reference to FIG. 18, and thus a detailed description thereof will be omitted.

Meanwhile, the compensation capacitor unit 150B according to another embodiment of the present disclosure may provide paths through which compensation currents IC1, IC2, and IC3 generated by the compensation transformer flow to the first high-current path 111B, the second high-current path 112B, and the third high-current path 113B, respectively.

The current compensation device 100B according to the embodiment described above may be used to cancel (or block) the first currents I11, I12, and I13 to each other, which are traveling from a load of a three-phase three-wire power system to a power source.

FIG. 22 is a diagram schematically illustrating a configuration of a current compensation device 100C according to still another embodiment of the present disclosure. Hereinafter, the description of contents overlapping the contents described with reference to FIGS. 16 to 21 will be omitted.

The current compensation device 100C according to the embodiment may actively compensates for first currents I11, I12, I13, and I14 that are input as a common-mode current with respect to each of high-current paths 111C, 112C, 113C, and 114C connected to a first device 300C.

To this end, the current compensation device 100C according to the embodiment may include four high-current paths 111C, 112C, 113C, and 114C, a sensing transformer 120C, an amplifier 130C, a compensation transformer 140C, and a compensation capacitor unit 150C.

When it is described in comparison with the current compensation device 100A according to the embodiment described with reference to FIGS. 17 to 20 and the current compensation device 100B according to the embodiment described with reference to FIG. 22, the current compensation device 100C according to the embodiment illustrated with reference to FIG. 22 includes four high-current paths 111C, 112C, 113C, and 114C, and thus has differences in the sensing transformer 120C and the compensation capacitor unit 150C. Thus, hereinafter, the current compensation device 100C will be described focusing on the above-described differences.

First, the current compensation device 100C according to the embodiment may include a first high-current path 111C, a second high-current path 112C, a third high-current path 113C, and a fourth high-current path 114C, which are separated from each other. According to one embodiment, the first high-current path 111C may be an R-phase power line, the second high-current path 112C may be an S-phase power line, the third high-current path 113C may be a T-phase power line, and the fourth high-current path 114C may be an N-phase power line. The first currents I11, I12, I13, and I14 may be input as a common-mode current with respect to each of the first high-current path 111C, the second high-current path 112C, the third high-current path 113C, and the fourth high-current path 114C.

A primary side 121C of the sensing transformer 120C according to the embodiment may be disposed in each of the first high-current path 111C, the second high-current path 112C, the third high-current path 113C, and the fourth high-current path 114C to generate a first induced current. Magnetic flux densities generated by the sensing transformer 120C due to the first currents I11, I12, I13, and I14 on the four high-current paths 111C, 112C, 113C, and 114C may be reinforced with each other. The process in which the first induced current is generated due to the first currents I11, I12, I13, and I14 is described with reference to FIG. 18, and thus a detailed description thereof will be omitted.

Meanwhile, the compensation capacitor unit 150C according to the embodiment may provide paths through which compensation currents IC1, IC2, IC3, and 14 generated by the compensation transformer flow to the first high-current path 111C, the second high-current path 112C, the third high-current path 113C, and the fourth high-current path 114C, respectively.

Figure 23:
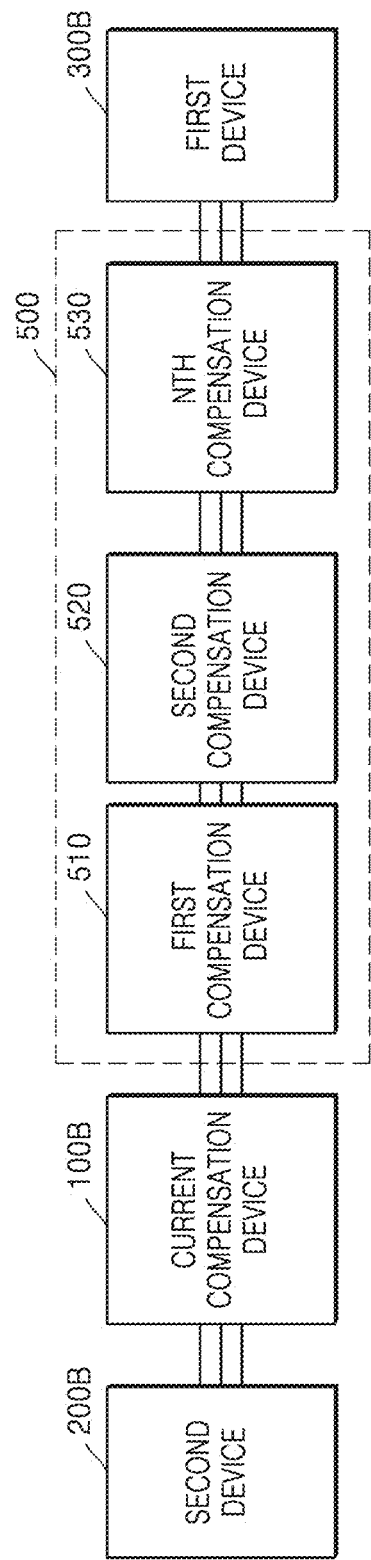
FIG. 23 is a diagram schematically illustrating a configuration of a system in which the current compensation device (100B) according to the embodiment illustrated in FIG. 21 is used.

The current compensation device 100C according to the embodiment described above may be used to cancel (or block) the first currents I11, I12, I13, and I14 to each other, which are traveling from a load of a three-phase four-wire power system to a power source, FIG. 23 is a diagram schematically illustrating a configuration of a system in which the current compensation device 100B according to the embodiment illustrated in FIG. 21 is used.

The current compensation device 100B according to the embodiment may be used with one or more other compensation devices 500 on the high-current path connecting a second device 200B and the first device 300B.

For example, the current compensation device 100B according to the embodiment may be used in conjunction with a first compensation device 510 configured to compensate for a first current input as a common-mode current. In this case, the first compensation device 510 may be implemented as an active element similar to the current compensation device 100B, or may be implemented only as a passive element.

Further, the current compensation device 100B according to the embodiment may be used in conjunction with a second compensation device 520 configured to compensate for a third current input as a differential-mode current. In this case, the second compensation device 520 may also be implemented as an active element, or may be implemented only as a passive element.

Further, the current compensation device 100B according to the embodiment may be used in conjunction with an nth compensation device 530 configured to compensate for a voltage. In this case, the nth compensation device 530 may also be implemented as an active element, or may be implemented only as a passive element.

Meanwhile, the type or quantity and the arrangement order of the compensation devices 500 described with reference to FIG. 23 are merely exemplary, and the scope of the present disclosure is not limited thereto. Accordingly, various quantities and types of compensation devices may be further included in the system depending on the design of the system. In addition, selectively, the embodiment illustrated with reference to FIG. 23 may be equally applicable to all other embodiments of the present specification.

A current compensation device configured to actively compensate for a first current input as a common-mode current with respect to each of at least two or more high-current paths connected to a first device according to one embodiment of the present disclosure may include the at least two or more high-current paths through which a second current supplied from a second device is transmitted to the first device, a sensor configured to sense the first current on the high-current paths and generate an output signal corresponding to the first current, an amplifier configured to amplify the output signal to generate an amplified output signal, a compensator configured to generate a compensation current on the basis of the amplified output signal, and a compensation capacitor unit configured to provide a path through which the compensation current flows to each of the at least two or more high-current paths.

The sensor may include a sensing transformer having a primary side disposed on the high-current paths and a secondary side that is connected to the amplifier and outputs the output signal, and the primary side may generate a first induced current, which is the output signal, directed toward the secondary side on the basis of a first magnetic flux density induced due to the first current.

The sensing transformer may be configured such that a second magnetic flux density induced due to a second current flowing through each of the two or more high-current paths satisfies a predetermined magnetic flux density condition.

The first current may be a current in a first frequency band, the second current may a current in a second frequency band different from the first frequency band, and a magnitude of the first magnetic flux density induced in the sensing transformer on the basis of the current in the first frequency band may be greater than a magnitude of the second magnetic flux density induced in the sensing transformer on the basis of the current in the second frequency band.

The secondary side of the sensing transformer may be disposed on a path connecting an input terminal of the amplifier and a reference potential of the amplifier.

The compensator may include a compensation transformer having a primary side disposed on a path connecting an output terminal of the amplifier and the reference potential of the amplifier and a secondary side disposed on a path connecting the compensation capacitor unit and a reference potential of the current compensation device.

The amplifier may receive power from a third device, which is distinct from the second device, and amplify the output signal to generate an amplified current that is the amplified output signal.

The compensation transformer may generate the compensation current directed toward the secondary side thereof on the basis of a third magnetic flux density induced due to the amplified current, which is the amplified output signal, on the primary side thereof.

The reference potential of the amplifier may be a potential different from the reference potential of the current compensation device.

The compensation capacitor unit may include at least two or more compensation capacitors each connecting each of the at least two or more high-current paths to the reference potential of the current compensation device, and may be configured such that a current flowing between the at least two or more high-current paths through the at least two or more compensation capacitors satisfies a first predetermined current condition, and a current flowing between each of the at least two or more high-current paths and the reference potential of the current compensation device through the at least two or more compensation capacitors satisfies a second current condition.

The at least two or more high-current paths may include a first high-current path, a second high-current path, and a third high-current path which are separated from each other, and the first current may be a common-mode current input to each of the first high-current path, the second high-current path, and the third high-current path. The sensor may includes a sensing transformer, and a primary side of the sensing transformer may be disposed on each of the first high-current path, the second high-current path, and the third high-current path and generate an output signal corresponding to the first current. The compensation capacitor unit may provide paths through which the compensation current flows to each of the first high-current path, the second high-current path, and the third high-current path.

The at least two or more high-current paths may include a first high-current path, a second high-current path, a third high-current path, and a fourth high-current path which are separated from each other, and the first current may be a common-mode current input to each of the first high-current path, the second high-current path, the third high-current path, and the fourth high-current path. The sensor may include a sensing transformer.

A primary side the sensing transformer may be disposed on each of the first high-current path, the second high-current path, the third high-current path, and the fourth high-current path and generate an output signal corresponding to the first current. The compensation capacitor unit may provide paths through which the compensation current flows to each to the first high-current path, the second high-current path, the third high-current path, and the fourth high-current path.

While the present disclosure has been described with reference to the embodiments shown in the drawings, which are merely exemplary, it will be understood by those of ordinary skill in the art that various modifications and equivalent other embodiments can be implemented from the given embodiments. Accordingly, the scope of the present disclosure to be protected should be determined by the technical scope defined in the appended claims.

The invention claimed is:

1. An isolated type active electromagnetic interference (EMI) filter having no additional elements on a power line, the filter comprising:
  a common-mode (CM) choke disposed on a power source side from which power is supplied, the CM choke having a form in which a winding is wound on each of a live line and a neutral line connected to an EMI source;
  a Y-cap disposed on an EMI source side at which EMI occurs and including two capacitors connected in series, wherein the two capacitors are connected between the live line and the neutral line and are commonly connected to the ground;
  a sensing winding wound on the CM choke and configured to sense a noise current of the CM choke;
  an amplifier configured to amplify the noise current sensed by the sensing winding;
  a transformer installed in front of the Y-cap, the transformer comprising a primary coil configured to receive a signal amplified by the amplifier and a secondary coil isolated from the power line by being connected to the ground connected to the Y-cap, the transformer configured to inject a signal of the secondary coil into the Y-cap as a compensation signal; and a bypass branch configured to serve as a bypass to avoid resonance and disposed between the Y-cap and the transformer, wherein the bypass branch comprises:

a first resistor ($R_{d1}$) comprising a first end connected to the Y-cap and a second end connected to the secondary coil of the transformer;

a capacitor ($C_d$) comprising a first end connected to the first end of the first resistor; and a second resistor ($R_{d2}$) comprising a first end connected in series with the second end of the capacitor and a second end connected to the ground.

2. The filter of claim 1, wherein when a capacitance of a parasitic circuit of the CM choke is referred to as $C_{cm}$, wherein a capacitance of a parasitic circuit of the sensing winding is referred to as $C_{sen}$, and wherein the number of turns ($N_{sen}$) of the sensing winding is less than a square root of $2 \times C_{cm}/C_{sen}$.

3. The filter of claim 1, further comprising a low-pass filter located at an input terminal of the amplifier.

4. The filter of claim 3, wherein the low-pass filter comprises:

a filter resistor ($R_f$) comprising a first end connected to the sensing winding and a second end connected to the amplifier; and a filter capacitor ($C_f$) comprising a first end connected to the second end of the filter resistor ($R_f$) and the amplifier, and a second end connected to the ground.

5. The filter of claim 3, wherein a first impedance ($Z_{in,\ AEF}$) viewed from the input terminal of the amplifier toward the low-pass filter is set greater than a second impedance ($Z_{sen,\ para}$) of parasitic RC components of the sensing winding.

6. The filter of claim 3, wherein a cutoff frequency of the low-pass filter is greater than a maximum operating frequency ($f_{op,max}$) determined by an inductance part of the transformer and a capacitance ($C_d$) of the bypass branch.

7. The filter of claim 6, wherein the cutoff frequency of the low-pass filter is less than a resonance frequency determined by a coupling coefficient ($K_{sen}$) of the sensing winding, a number of turns ($N_{sen}$) of the sensing winding, an inductance ($L_{cm}$) of the CM choke, capacitance ($C_{sen}$) of a parasitic circuit of the sensing winding.

8. The filter of claim 1, further comprising a phase compensator connected to an output terminal of the amplifier.

9. The filter of claim 8, wherein the phase compensator comprises:

a compensation resistor ($R_c$) and a compensation capacitor ($C_c$) connected in parallel to each other, wherein each of the compensation resistor ($R_c$) and the compensation capacitor ($C_c$) comprises a first end and a second end opposing each other, wherein the first end of the compensation resistor ($R_c$) and the first end of the compensation capacitor ($C_c$) are connected to an input terminal of the amplifier, and wherein the second end of the compensation resistor ($R_c$) and the second end of the compensation capacitor ($C_c$) are connected to the output terminal of the amplifier.

\* \* \* \* \*